(12) United States Patent
Chaudhari et al.

(10) Patent No.: US 11,460,290 B2
(45) Date of Patent: Oct. 4, 2022

(54) MEASURING METHOD AND SEMICONDUCTOR STRUCTURE FORMING METHOD

(71) Applicant: TAIWAN SEMICONDUCTOR MANUFACTURING COMPANY LTD., Hsinchu (TW)

(72) Inventors: Pradip Girdhar Chaudhari, Hsinchu (TW); Che-Hui Lee, Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 35 days.

(21) Appl. No.: 16/996,828

(22) Filed: Aug. 18, 2020

(65) Prior Publication Data
US 2021/0095950 A1   Apr. 1, 2021

Related U.S. Application Data

(60) Provisional application No. 62/907,985, filed on Sep. 30, 2019.

(51) Int. Cl.
| | | |
|---|---|---|
| *G01B 7/30* | (2006.01) | |
| *G01B 7/14* | (2006.01) | |
| *C23C 14/35* | (2006.01) | |

(52) U.S. Cl.
CPC .............. *G01B 7/30* (2013.01); *G01B 7/14* (2013.01); *C23C 14/35* (2013.01)

(58) Field of Classification Search
CPC ......... G06T 1/00; G06T 2200/00; B82Y 5/00; H01L 21/00; H01L 2221/00
See application file for complete search history.

(56) References Cited

U.S. PATENT DOCUMENTS

| | | | | |
|---|---|---|---|---|
| 6,244,121 B1* | 6/2001 | Hunter | ................ | G03F 7/707 |
| | | | | 73/865.9 |
| 2004/0151978 A1* | 8/2004 | Huang | ................ | H01F 1/009 |
| | | | | 427/256 |
| 2014/0218503 A1* | 8/2014 | Gerling | ................ | G01B 7/02 |
| | | | | 348/92 |

(Continued)

FOREIGN PATENT DOCUMENTS

| | | |
|---|---|---|
| TW | 201727255 A | 8/2017 |
| TW | 201806051 A | 2/2018 |

OTHER PUBLICATIONS

Office Action, Cited References and Search Report dated Apr. 12, 2021 by the Taiwan Intellectual Property Office for Taiwanese counterpart application No. 109132592.

*Primary Examiner* — Jermele M Hollington
*Assistant Examiner* — Temilade S Rhodes-Vivour
(74) *Attorney, Agent, or Firm* — WPAT, P.C., Intellectual Property Attorneys; Anthony King

(57) ABSTRACT

A measuring method is provided. A probe and a first sensor are disposed over a jig including a bar protruding from the jig. The probe is moved until a first surface of the probe is laterally aligned with a second surface of the bar facing the jig. A first distance between the second surface of the bar and the first sensor is obtained by the first sensor. The probe and the first sensor are disposed over a magnetron. Magnetic field intensities at different elevations above the magnetron are measured by the probe. A method for forming a semiconductor structure is also provided.

20 Claims, 29 Drawing Sheets

(56) References Cited

U.S. PATENT DOCUMENTS

2016/0238383 A1\* 8/2016 Kane, II ............... G05B 19/401
2018/0240656 A1\* 8/2018 Gorokhovsky ......... C23C 14/22
2018/0277344 A1\* 9/2018 Tian .................... H01J 37/3479

\* cited by examiner

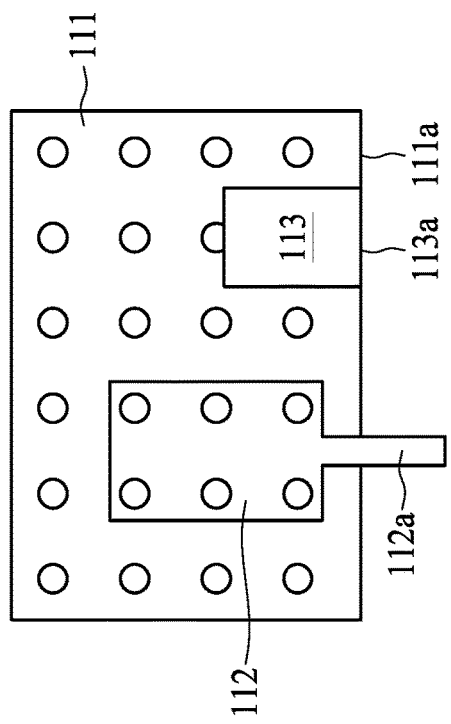
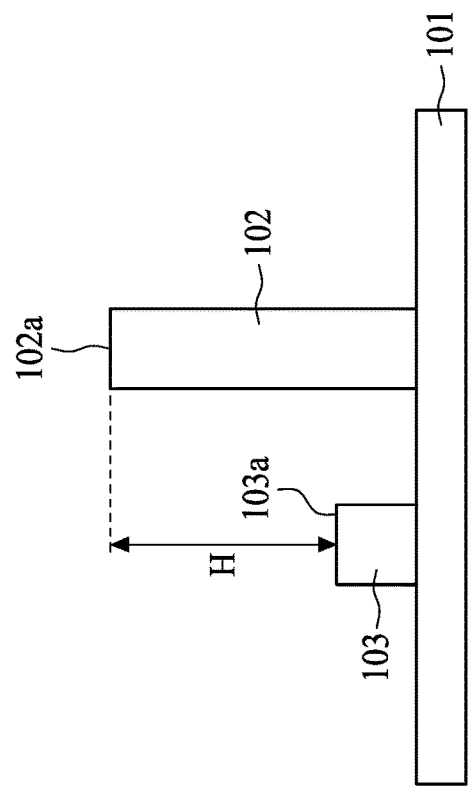
FIG. 3

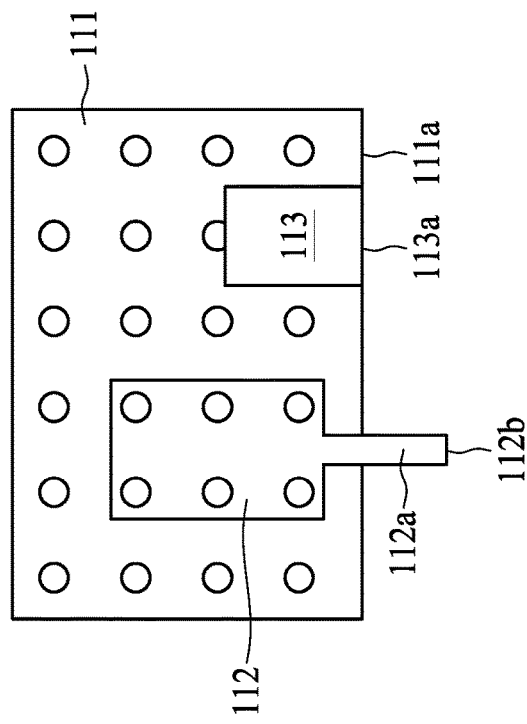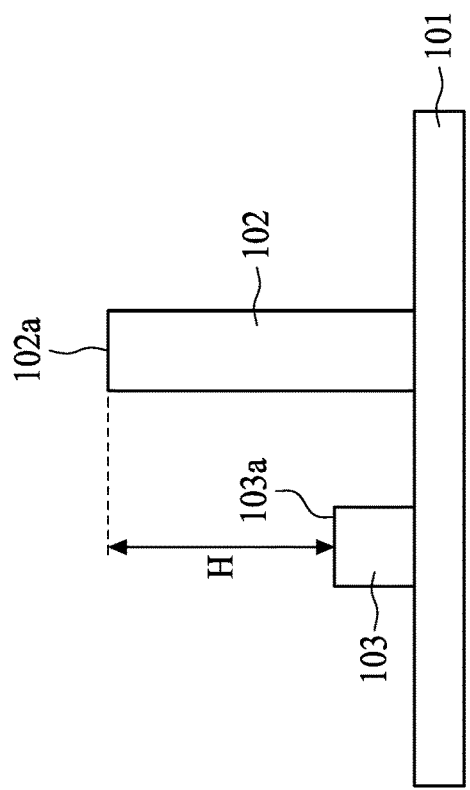
FIG. 4

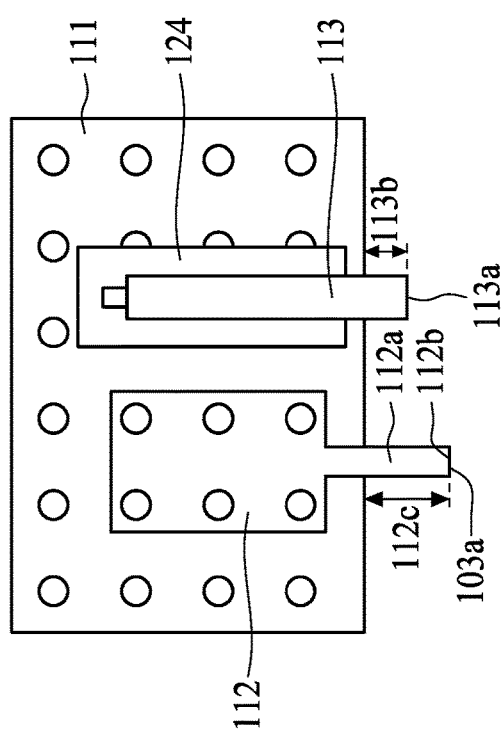
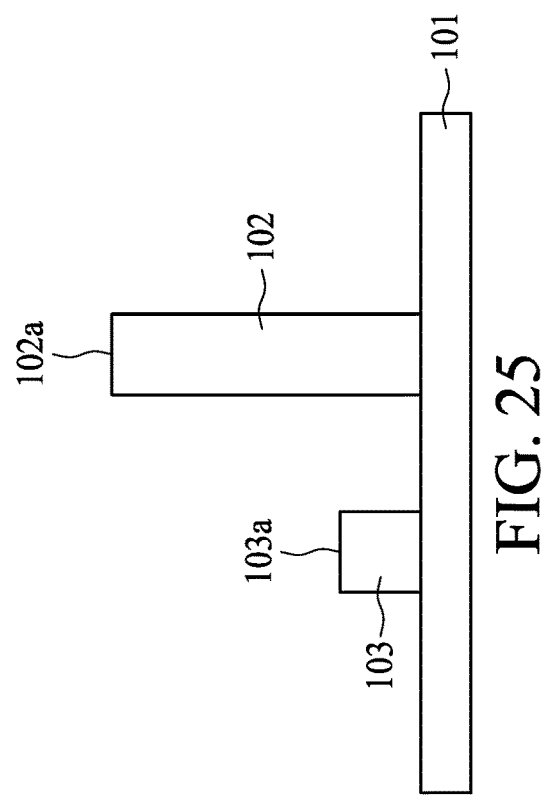
FIG. 25

MEASURING METHOD AND SEMICONDUCTOR STRUCTURE FORMING METHOD

PRIORITY CLAIM AND CROSS-REFERENCE

This application claims the benefit of provisional application Ser. 62/907,985 filed on Sep. 30, 2019, entitled "CALIBRATION OF SEMICONDUCTOR DEPOSITION EQUIPMENT," the disclosure of which is hereby incorporated by reference in its entirety.

BACKGROUND

With the advancement of electronic technology, semiconductor devices are steadily becoming smaller in size while providing greater functionality and including greater amounts of integrated circuitry. Due to the miniaturized scale of the semiconductor device, a number of semiconductor components are assembled on the semiconductor device. Furthermore, numerous manufacturing operations are implemented within such a small semiconductor device.

Prior to fabrication of the semiconductor device, calibration of a manufacturing apparatus is performed. Components of the manufacturing apparatus must undergo tuning or adjustment for the purpose of fabrication stability and repeatability. The manufacturing operations can be repeatedly implemented on each of the semiconductor devices, and semiconductor components can be accurately assembled on the semiconductor device. However, the calibration of the manufacturing apparatus is dependent on accuracy of data associated with physical properties of each component of the manufacturing apparatus (i.e., dimensions, coefficient of thermal expansion, lifespan, hardness, etc.). As such, maintaining stability of the manufacturing apparatus and manufacturing repeatability of the semiconductor device may present challenges.

Therefore, there is a continuous need to modify and improve the fabrication of the semiconductor device and the manufacturing apparatus for fabricating the semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3 to 14 are schematic diagrams illustrating different stages of a measuring method in accordance with some embodiments of the present disclosure.

FIGS. 25 to 27 are schematic diagrams illustrating using an optical sensor and a pressure sensor to perform the methods shown in FIGS. 15 to 17 in accordance with some embodiments of the present disclosure.

DETAILED DESCRIPTION OF THE DISCLOSURE

Figure 1:
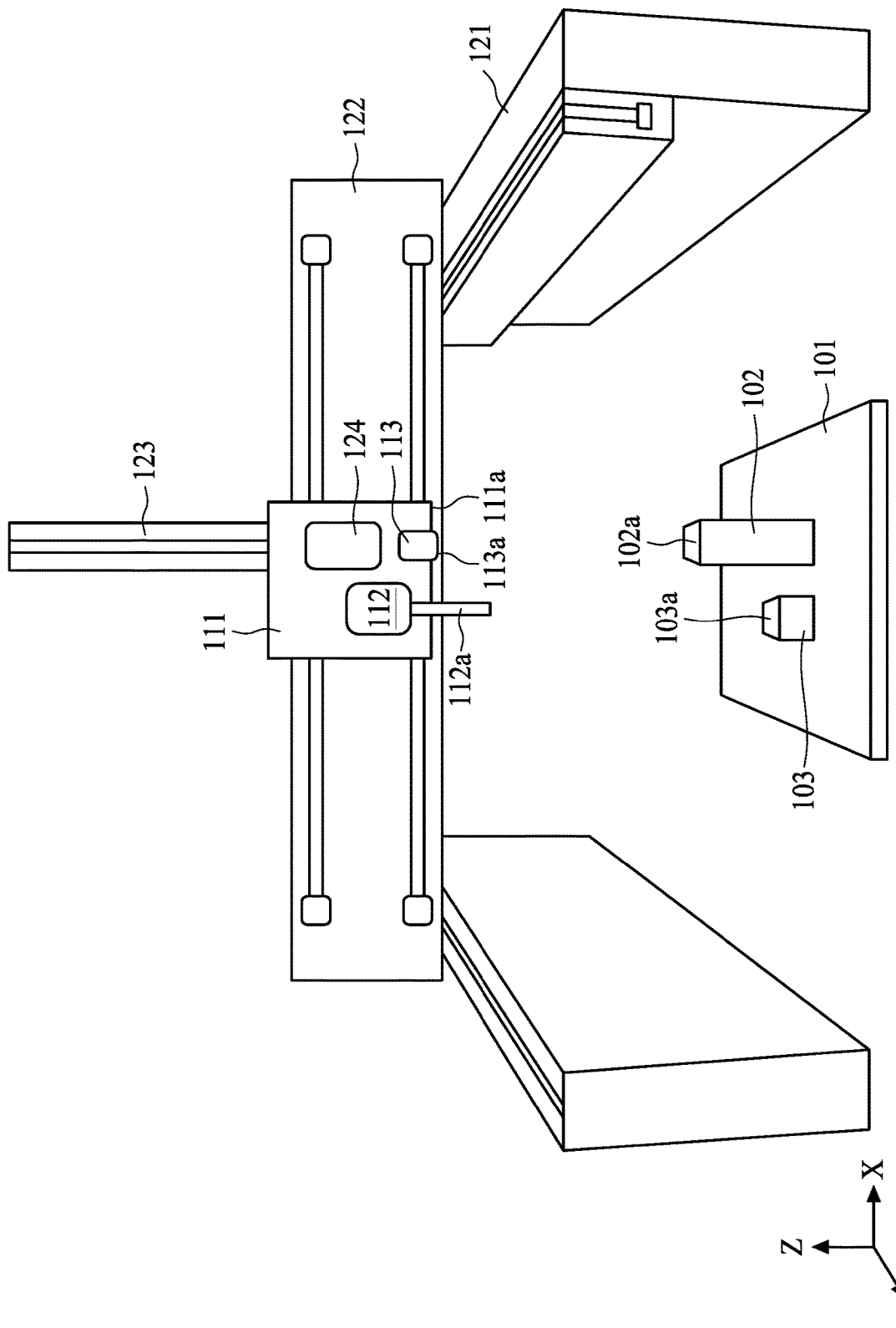
FIG. 1 is a schematic diagram of a calibration apparatus in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The disclosure relates to a method of calibrating semiconductor equipment, such as physical vapor deposition (PVD) equipment. The PAID equipment is widely used in thin-film deposition in the process of semiconductor manufacturing. The performance of the PVD equipment is closely related to two major components of the PVD equipment, i.e., the magnetron and the target. A magnetic field generated by the magnetron and formed around the surface of the target plays an important role in the deposition operation. The magnetic field is measured using a magnetic sensor, and it is necessary to maintain a distance between the magnetron and the target during the deposition operation in order to apply a required strength of the magnetic field on the target. The distance between the magnetron and the target may vary according to different deposition applications, and therefore manual inspection and calibration of the distance must be performed on the chamber before a PVD task is performed. However, the manual calibration of the magnetron may not provide sufficient efficiency and accuracy when the magnetron is off the chamber. Therefore, the deposition performance may be degraded.

The above issues can be addressed by implementing a calibration method. The calibration method may include mapping positions of a sensor relative to a surface of the magnetron, obtaining several parameters (e,g. magnetic fields across the surface of the magnetron, distances between the sensor and the magnetron, etc.) over the magnetron by the sensor, recording those parameters and modelling a film production (e.g. magnetic fields at different elevations above and across the surface of the magnetron, etc.) based on the parameters, and selecting a suitable elevation above the magnetron based the modelling results in order to achieve desired film characteristics during the film production.

In some embodiments, a calibration method includes mapping positions of a sensor relative to a surface of a circular magnetron using a polar coordinate system, measuring magnetic fields at different elevations above and across the surface of the circular magnetron, and selecting a suitable elevation above the circular magnetron based on the measurements, and then installing the circular magnetron inside a PVD chamber based on the selected elevation.

In some embodiments, a calibration or measuring method is provided to automatically detect a minimum distance of a magnetic sensor from a magnetron, measure a magnetic intensity at different elevations above the magnetron, and record the magnetic intensity and distance at the different elevations above a top surface of the magnetron. The recorded distances are used as a reference to determine an approximate size of a gap between the magnetron and the target. An artificial intelligence (AI) data training scheme may be incorporated into the calibration, in which the inspection performance of the magnetic sensor using an optical sensor or a pressure sensor can be improved through the AI data training approach. The data repeatability and accuracy of the measuring result can be enhanced accordingly.

FIG. 1 is a schematic diagram of a calibration apparatus 100 in accordance with some embodiments of the present disclosure. The calibration apparatus 100 includes a jig 101, having a reference bar 102 and a first sensor 103 installed thereon. The reference bar 102 protrudes from the jig 101. In some embodiments, the first sensor 103 also protrudes from the jig 101. In some embodiments, the jig 101 can be a plate for holding the first sensor 103 and the reference bar 102. In some embodiments, the jig 101 can be a metal plate. In some embodiments, the reference bar 102 is a metal rod installed on the jig 101. In some embodiments, the first sensor 103 is installed within the jig 101 and has a top surface 103a. In some embodiments, the first sensor 103 has an upward-facing sensing direction. In some embodiments, the first sensor 103 includes one or more types of sensors. In some embodiments, the first sensor 103 may include an optical sensor, a pressure sensor, or other suitable types of sensors. A configuration of the reference bar 102 can be adjusted according to different applications. In the embodiments shown in FIG. 1, the reference bar 102 is a straight bar; however, it is not limited thereto. In other embodiments, the reference bar 102 can be a rounded protrusion or a top surface 102a in a dome shape.

The calibration apparatus 100 also includes a carrier 111, a measuring tool 112 and a second sensor 113. In some embodiments, the measuring tool 112 and the second sensor 113 are installed on the carrier 111. In some embodiment, the carrier 111, the measuring tool 112 and the second sensor 113 are disposed over the jig 101. In some embodiments, the carrier 111 can be a metal plate extending along a first direction Z as shown in FIG. 1. In some embodiments, the second sensor 113 includes one or more types of sensors. In some embodiments, the second sensor 113 includes one or more of an optical sensor and a pressure sensor.

In some embodiments, the measuring tool 112 is configured to measure a magnetic field intensity. In some embodiments, the measuring tool 112 includes a probe 112a protruding from the measuring tool 112. In some embodiments, the probe 112a can be any type of magnetic field probe such as Gauss probe or the like. In some embodiments, the probe 112a protrudes from the carrier 111 along the first direction Z. In other words, the probe 112a protrudes from the carrier 111 toward the jig 101. In some embodiments, a lower surface 113a of the second sensor 113 is substantially coplanar with a lower surface 111a of the carrier 111. In some embodiments, the second sensor 113 is entirely disposed within the carrier 111.

The calibration apparatus 100 includes one or more motors. As illustrated in FIG. 1, the one or more motors include a first motor 121, a second motor 122, and a third motor 123. The first motor 121 is configured to move the carrier 111, the measuring tool 112 and the second sensor 113 along a second direction Y. The second motor 122 is configured to move the carrier 111, the measuring tool 112 and the second sensor 113 along a third direction X. The third motor 123 is configured to move the carrier 111, the measuring tool 112 and the second sensor 113 along the first direction Z. Thus, the carrier 111, the measuring tool 112 and the second sensor 113 can be moved together along the first direction Z, the second direction Y or the third direction X. In some embodiments, the first motor 121, the second motor 122 and the third motor 123 are directly or indirectly connected to the carrier 111. In the embodiment shown in FIG. 1, the carrier 111 is directly connected to the second motor 122, while indirectly connected to the first motor 121 and the third motor 123.

The disclosure is not limited to above. In other embodiments, the carrier 111 can be omitted. Therefore, the measuring tool 112 and the second sensor 113 are movable individually along the first direction Z, the second direction Y and the third direction X. In some embodiments, a position or movement of the measuring tool 112 and the second sensor 113 can be individually controlled. In some embodiments, the measuring tool 112 and the second sensor 113 can be moved independently along the second direction Y by the first motor 121. In some embodiments, the measuring tool 112 and the second sensor 113 can be moved independently along the third direction X by the second motor 122. In some embodiments, the measuring tool 112 and the second sensor 113 can be moved independently along the first direction by the third motor 123. In some embodiments, a fourth motor 124 is installed on the carrier 111 to control the movement of the second sensor 113, independent from the carrier 111 and the measuring tool 112.

In some embodiments, the calibration apparatus 100 also includes a user interface for an operator to control the movement of the carrier 111, the measuring tool 112 and the second sensor 113. In some embodiments, the calibration apparatus 100 includes a central processing unit (CPU). A first instruction from the user interface is sent to the CPU and the CPU generates a second instruction configured to control movements of the carrier 111, the measuring tool 112 and the second sensor 113. In some embodiments, the second instruction is transmitted to the first motor 121, the second motor 122, the third motor 123 and/or the fourth motor 124. In some embodiments, the calibration apparatus 100 may include a software configured to communicate with the first sensor 103 and the second sensor 113. The software can integrate the hardware (including, for instance, the carrier 111, the measuring tool 112, the second sensor 113, the first motor 121, the second motor 122, the third motor 123, etc.) of the calibration apparatus 100 to perform a measuring or calibration method. In some embodiments, the software is used to control those hardware movements, send commands to the hardware, read and determine positions of the hardware, obtain measurements, load experimental parameters, and/or collect data automatically.

The disclosure also provides a method of using the calibration apparatus 100 for measuring magnetic field intensities of a magnetron at different elevations above a top surface of the magnetron. The different elevations are correlated with the magnetic field intensities from the magnetron. The method can obtain an optimum height above the top surface of the magnetron. A magnetic field distribution at the optimum height is in optimal. After obtaining the optimum height by the method, a distance between the magnetron and a target can be maintained in an optimal during PVD operation with reference to the optimum height. Therefore, a film disposed on a substrate with good uniformity can be obtained by such PVD operation.

Figure 2:
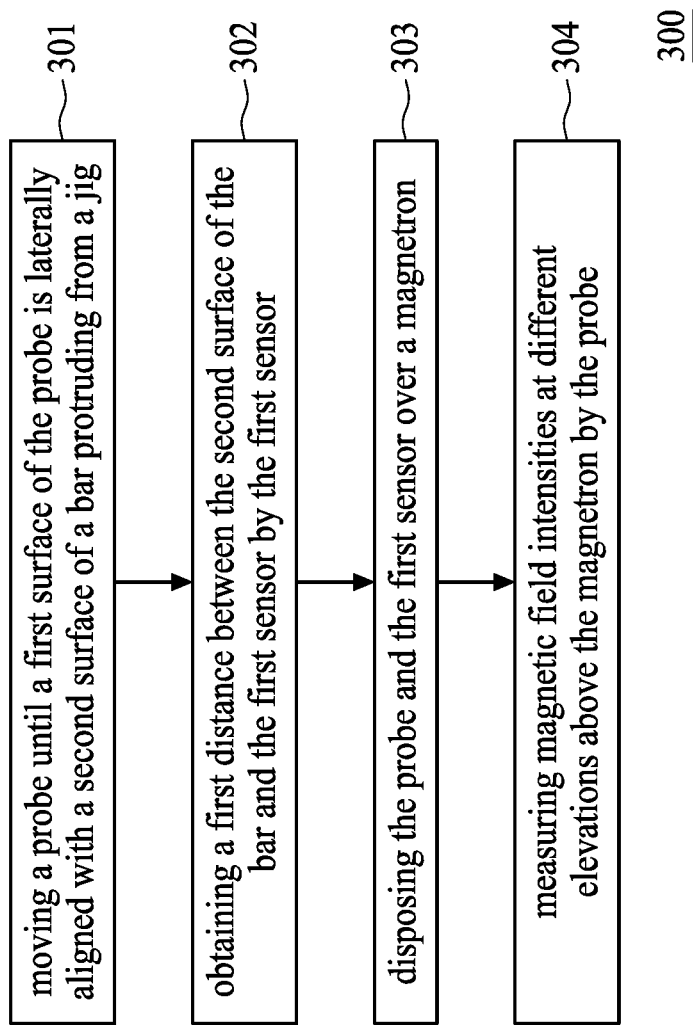
FIG. 2 is a flowchart of a measuring method in accordance with some embodiments of the present disclosure.

In some embodiments of the present disclosure, a measuring method 300 is provided. The measuring method 300 includes several operations 301 to 304 as shown in FIG. 2. FIGS. 3 to 14 are schematic diagrams illustrating the jig 101, the reference bar 102, the first sensor 103, the carrier 111, the measuring tool 112 and the second sensor 113 at different stages of the method. In addition, for purposes of illustration, embodiments that include an optical sensor as the first sensor 103 and an optical sensor as the second sensor 113 are illustrated in FIGS. 3 to 14 and the following description, but the disclosure is not limited herein.

Figure 5:
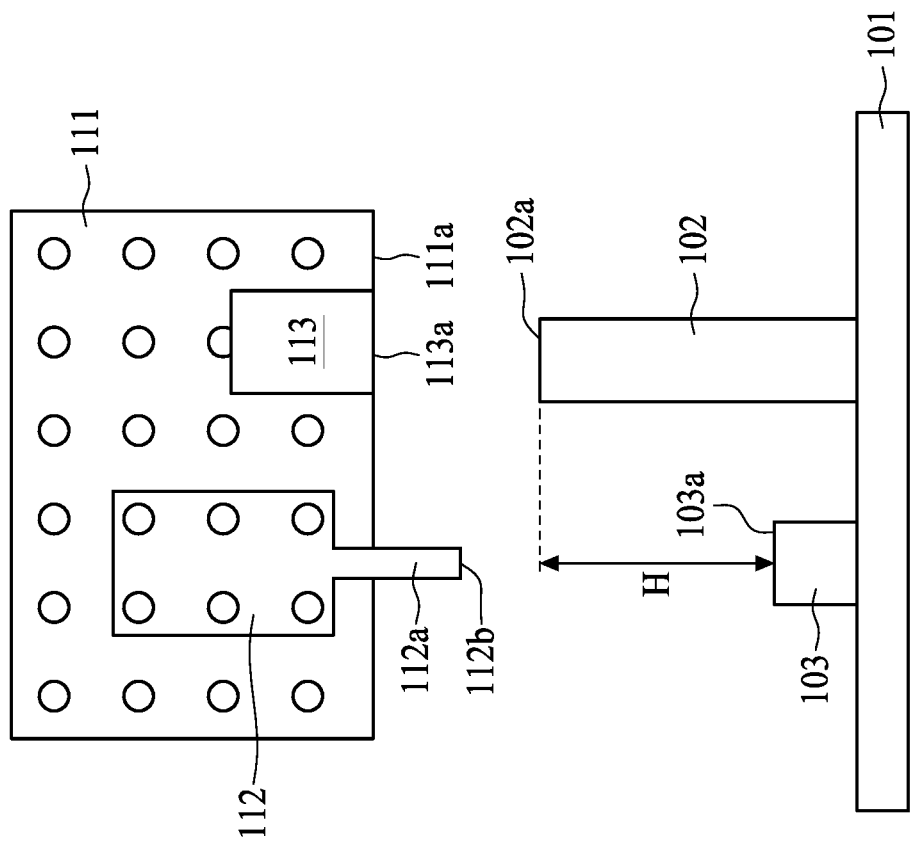
Figure 6:
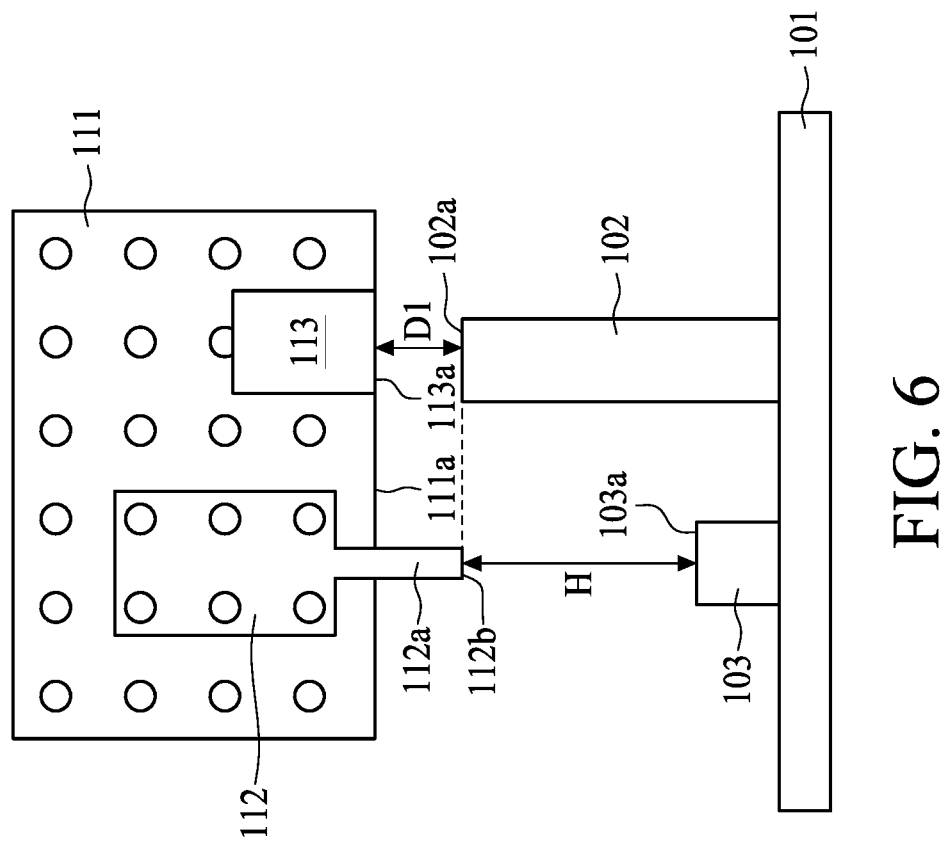

In some embodiments, the operation 301 includes several stages as shown in FIGS. 3-6. In the operation 301, a probe 112a is moved until a lower surface 112b of the probe 112a is laterally aligned with a top surface 102a of a bar 102 protruding from a jig 101 as shown in FIG. 6. Referring to FIG. 3, the jig 101 and the carrier 111 are provided or received. In some embodiments, the reference bar 12 and the first sensor 103 are installed on and protruded from the jig 101. In some embodiments, the measuring tool 112 and the second sensor 113 are installed on the carrier 111. In some embodiments, the probe 112a of the measuring tool 112 protrudes from the carrier 111.

Referring to FIG. 4, the carrier 111 moves over and toward the jig 101, in some embodiments, the measuring tool 112 is disposed above the first sensor 103, and the second sensor 113 is disposed above the reference bar 102. In some embodiments, the probe 112a is disposed above the top surface 103a of the first sensor 103, and the lower surface 113a of the second sensor 113 is disposed above the top surface 102a of the reference bar 102. In some embodiments, the measuring tool 112 is vertically aligned with the first sensor 103, and the second sensor 113 is vertically aligned with the reference bar 102. In some embodiments, the carrier 111 is moved manually (e.g. by an operator) or automatically (e.g by motors with controllers) over the jig 101.

In some embodiments, the first sensor 103 is configured to detect and locate the probe 112a. Once the probe 112a is located by the first sensor 103, the probe 112a or the carrier 111 is stopped over the first sensor 103. In some embodiments, the first sensor 103 sends signals to the CPU, and when the probe 112a enters a detection range of the first sensor 103, the CPU instructs and stops the first motor 121, the second motor 122 and the third motor 123. In some embodiments, the second sensor 113 is moved individually, and can detect and locate the reference bar 102. In some embodiments, the second sensor 113 is stopped when it is vertically aligned with the reference bar 102.

Referring to FIG. 5, the carrier 111 is moved toward the jig 101. In some embodiments, the carrier 111 moves vertically toward the jig 101. Referring to FIG. 6, as the carrier 111 moves toward the jig 101, the lower surface 112b of the probe 112a becomes substantially coplanar with the top surface 102a of the reference bar 102. The carrier 111 is moved vertically over the jig 101 until the lower surface 112b of the probe 112 is at a same level as the top surface 102a of the reference bar 102. The dashed line in FIG. 6 represents an extension of the top surface 102a of the reference bar 102 for a purpose of illustration. In some embodiments, the carrier 111 stops when the lower surface 112b of the probe 112a is laterally aligned with or coplanar with the top surface 102a of the reference bar 102. The lower surface 112b of the probe 112 faces the jig 101. In some embodiments, the lower surface 112b may be not a planar surface, but a rounded surface. In some embodiments, the top surface 102a of the reference bar 102 faces the second sensor 113. In some embodiments, the top surface 102a of the reference bar 102 is designed to be a planar surface, but the disclosure is not limited thereto.

Figure 7:
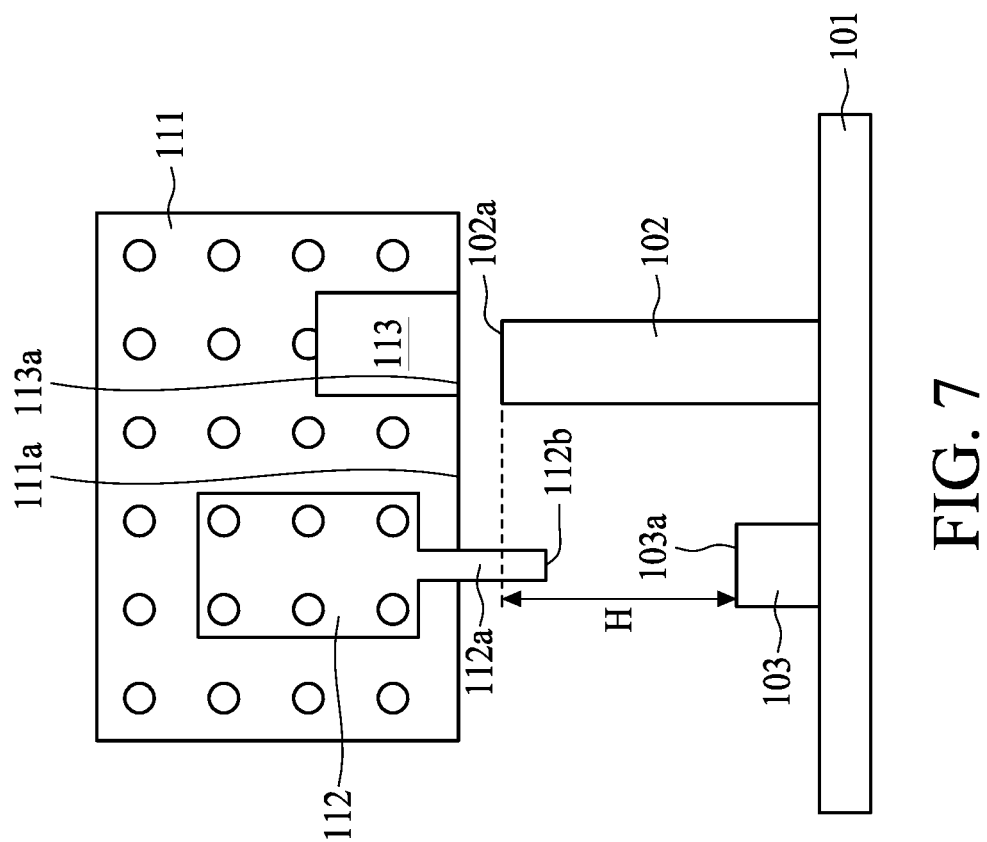

In some embodiments, the carrier 111 keeps moving toward the jig 101 and it is possible for the lower surface 112b of the probe 112a to be lower than the top surface 102a of the reference bar 102 as shown in FIG. 7. The first sensor 103 detects that the lower surface 112b of the probe 112a is lower than the top surface 102a of the reference bar 102, and a signal is sent to the CPU in order to control the third motor 123 to move the carrier 111 upward until the lower surface 112b of the probe 112a is coplanar with the top surface 102a of the reference bar 102 as shown in FIG. 6.

In order to accurately detect that the lower surface 112b of the probe 112a is coplanar with the top surface 102a of the reference bar 102, a height difference H between the top surface 103a of the first sensor 103 and the top surface 102a of the reference bar 102 is designed depending on a reading range of the first sensor 103.

Figure 8:
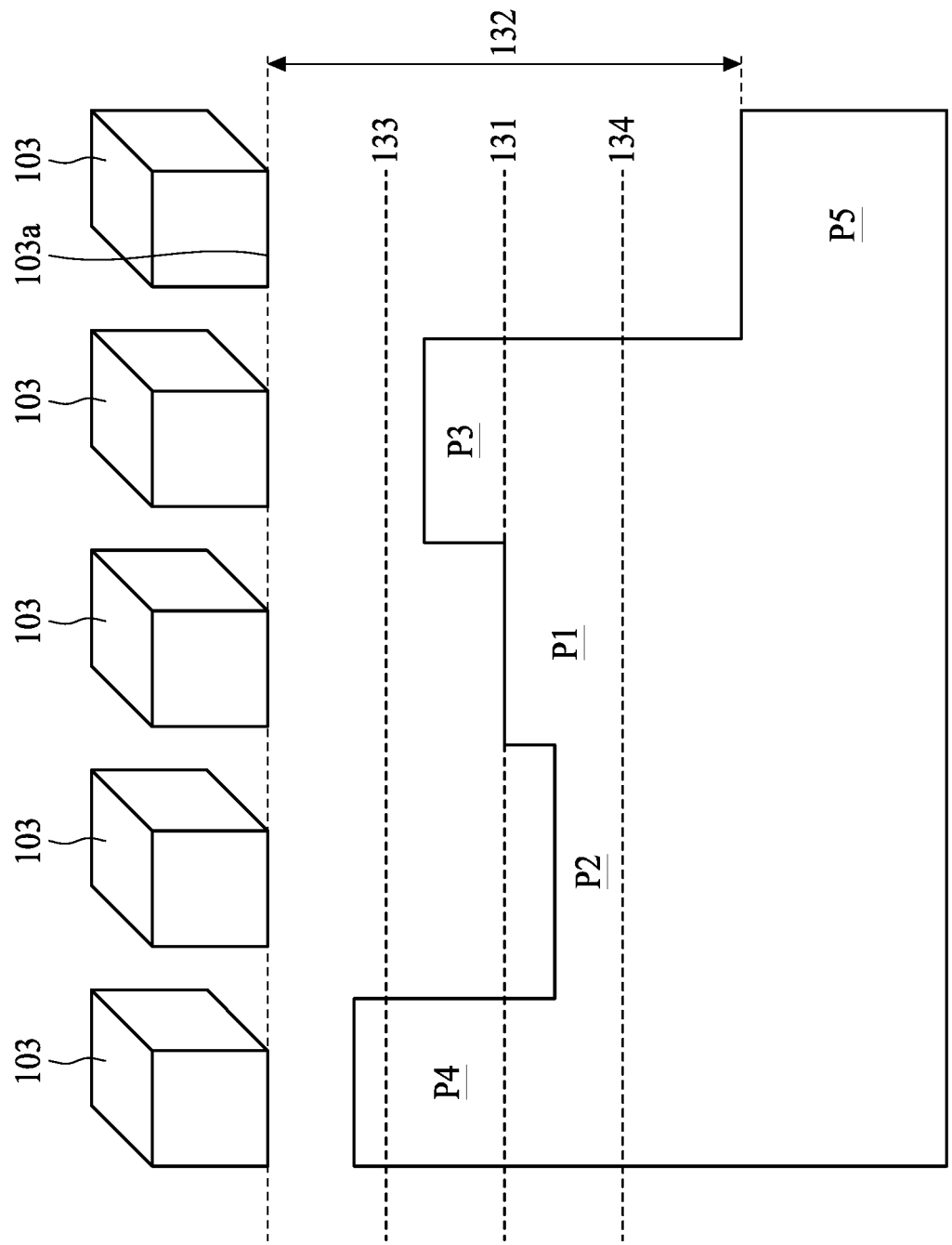

Referring to FIG. 8, in accordance with some embodiments for a purpose of illustration, a center reading 131 is defined. The center reading 131 is a central position of a reading range 132 of the first sensor 103. The center reading 131 is at a half of the reading range 132. In some embodiments, the reading range 132 is about 200 mm. In some embodiments, the center reading 131 is located at a position about 100 mm away from the lower surface 112b of the probe 112. In some embodiments, the center reading C of the first sensor 103 is also referred to as a zero reading. In some embodiments, a first position 133 and a second position 134 are defined. In some embodiments, the first position 133 is located at a position about Y mm from the center reading 131 towards the first sensor 103, and the second position 134 is located at a position about Y mm from the center reading 131 and away from the first sensor 103. In some embodiments, Y is a number greater than zero.

When a distance between a position P1 and the first sensor 103 is equal to the center reading 131, then a reading of the first sensor 103 is zero, which can then be calculated or translated as the half of the reading range 132 (e.g. 100 mm). When a position P2 is lower than the position P1 and within the reading range 132 of the first sensor 103, then a reading of the first sensor 103 is a negative value, which can then be calculated into a distance between the first sensor 103 and the position P2 greater than the half of the reading range 132. Similarly, when a position P3 is higher than the position P1 and within the reading range 132 of the first sensor 103, then a reading of the first sensor 103 to the position P3 is a positive value, which can then be used to calculate a distance between the first sensor 103 and the position P3 being less than the half of the reading range 132. When a position P4 is higher than the position P1 and the first position 133, then a distance between the position P4 and the first sensor 103 is not available. Similarly, when a position P5 is lower than the position P1 and the second position 134, then a distance between the position P4 and the first sensor 103 is not available. It should be noted that the center reading 131 and the reading range 132 can be adjusted depending on different applications and a specification of the first sensor 103, and it is not limited herein.

Referring back to FIG. 6, the height difference H between the top surface 103a of the first sensor 103 and the top surface 102a of the reference bar 102 is designed to be within the reading range 132 of the first sensor 103. The first sensor 103 is able to detect that the lower surface 112b of the probe 112a is coplanar with the top surface 102a of the reference bar 102. In some embodiments, for purposes of detection and ease of calculation, the height different H is designed to be substantially equal to the center reading 131 of the first sensor 103. In some embodiments, the top surface 102a of the reference bar 102 is initially defined to be a zero reading of the first sensor 103.

In some embodiments, the operation 302 is implemented as shown in FIG. 6. In the operation 302, a distance D1 between the second sensor 113 and the top surface 102a of the reference bar 102 is obtained or recorded by the second sensor 113 as a reference reading when the lower surface 112a of the probe 112 is coplanar with the top surface 102a of the reference bar 102. In some embodiments, the operation 302 is implemented after the operation 301.

Figure 9:
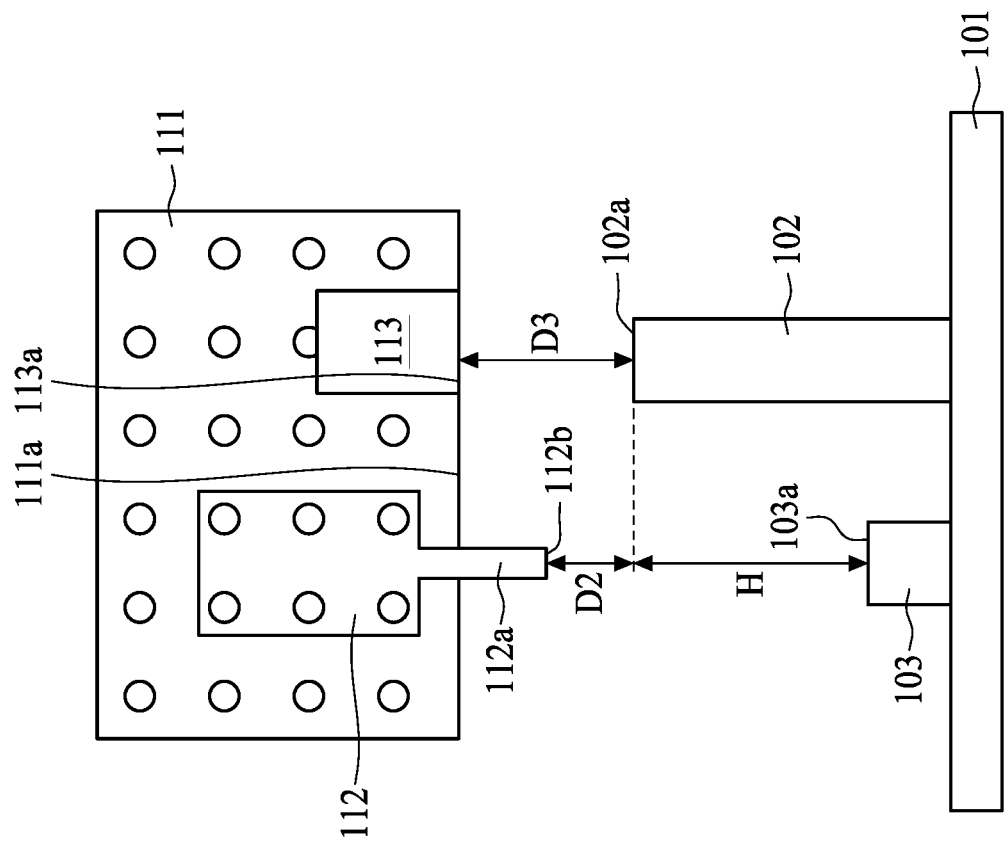

Referring to FIG. 9, in the subsequent operation of the measuring method, in order to ensure that the probe 112a does not touch a top surface of the magnetron during the measurement, the carrier 111 is moved upwardly away from the jig 101 by a default distance D2. In some embodiments, the default distance D2 can be equal to 0.5 cm, 1 cm or 2 cm. In some embodiments, the default distance D2 is less than 5 cm. The default distance D2 can ensure the probe 112a would not harm the magnetron during the calibration. In the embodiments, a distance D3 between the top surface 102a of the reference bar 102 and the second sensor 113 is obtained or recorded by the second sensor 113 after the carrier 111 is moved upwardly away from the jig 101 by the default distance D2. In some embodiments, the distance D3 is equal to a total of the default distance D2 and the distance D1.

Figure 10:
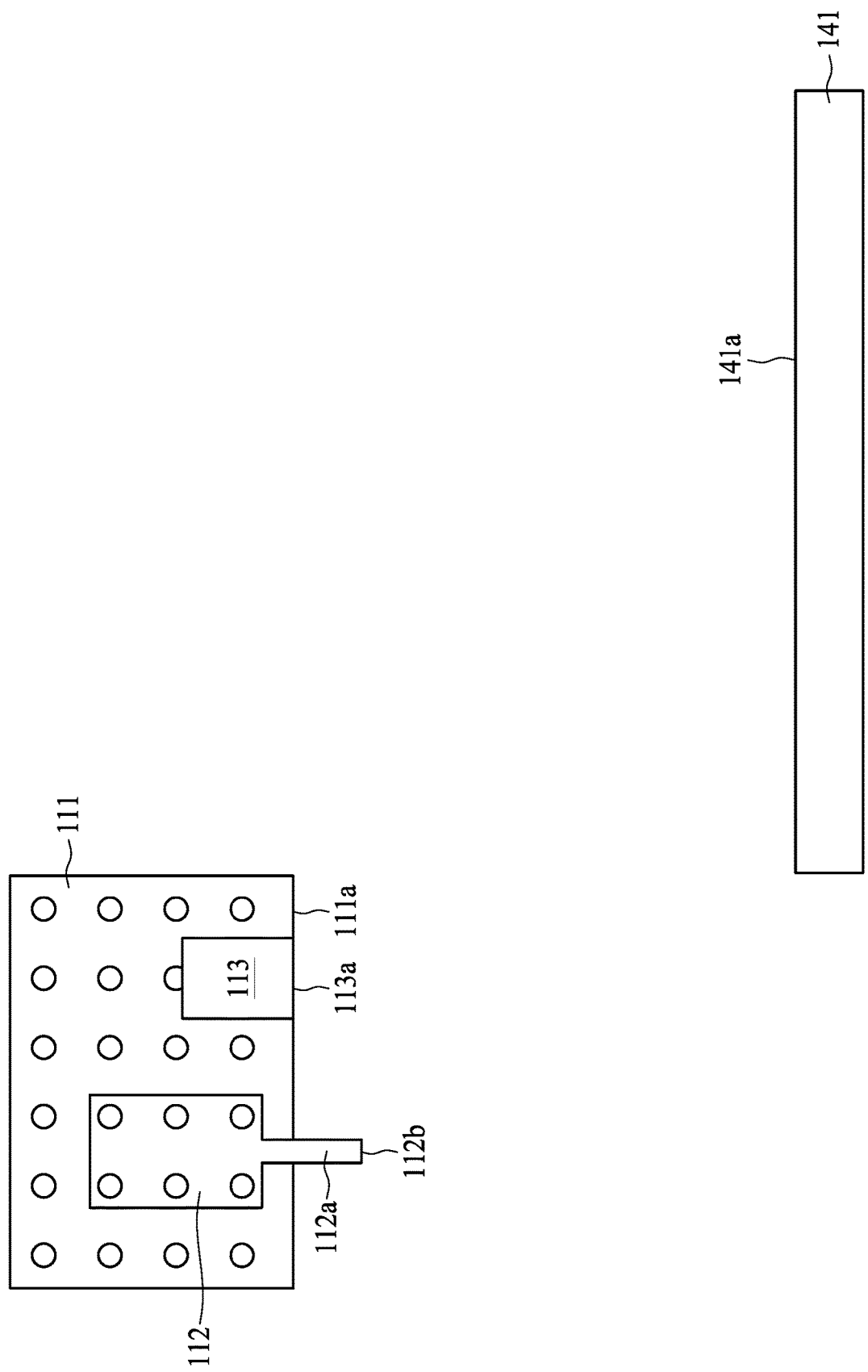
Figure 11:
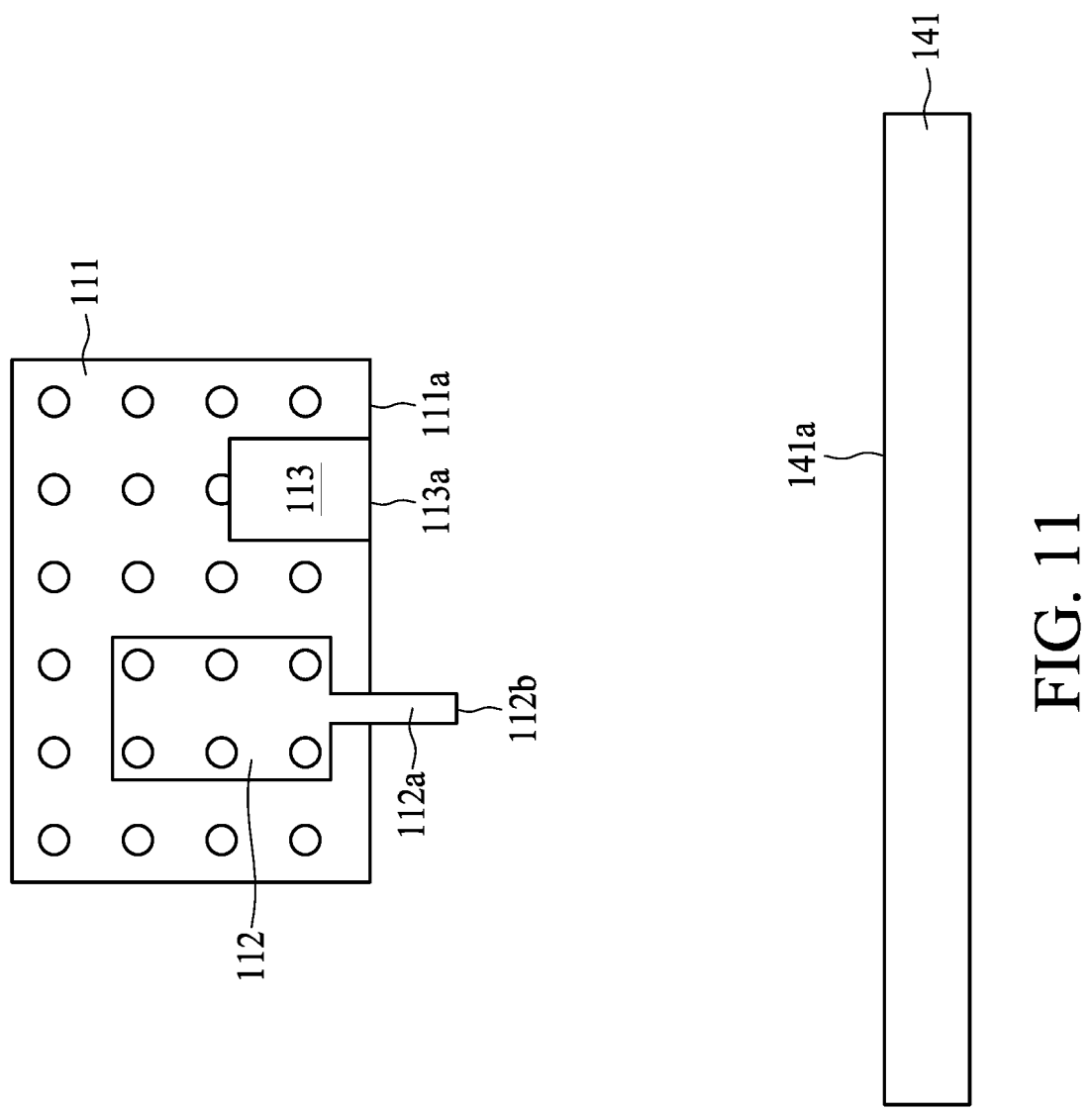

In some embodiments, the operation 303 includes several stages as shown in FIGS. 10-11. In the operation 303, the probe 112a and the second sensor 113 are disposed over a magnetron 141 as shown in FIG. 11. Referring to FIGS. 10 to 11, the carrier 111, the measuring tool 112 and the second sensor 113 move toward and are disposed above the magnetron 141. In some embodiments, the carrier III is moved by the first motor 121, the second motor 122 and the third motor 123. In some embodiments, the probe 112a is disposed at a position over the magnetron 141 and adjacent to a center of a top surface 141a of the magnetron 141. In some embodiments, the center of the top surface 141a of the magnetron 141 is obtained based on any suitable method before the operation 303, such that the probe 112a is disposed over and substantially vertically aligned with the center of the top surface 141a of the magnetron 141, wherein the top surface 141a faces the carrier 111. In some embodiments, when the carrier 111 is disposed over the top surface 141a of the magnetron 141, a distance between the second sensor 113 and the top surface 141a of the magnetron 141 is greater than the distance D1. In some embodiments, the second sensor 113 is disposed away from the top surface 141a of the magnetron 141 according to a result obtained from the operation 302.

Figure 12:
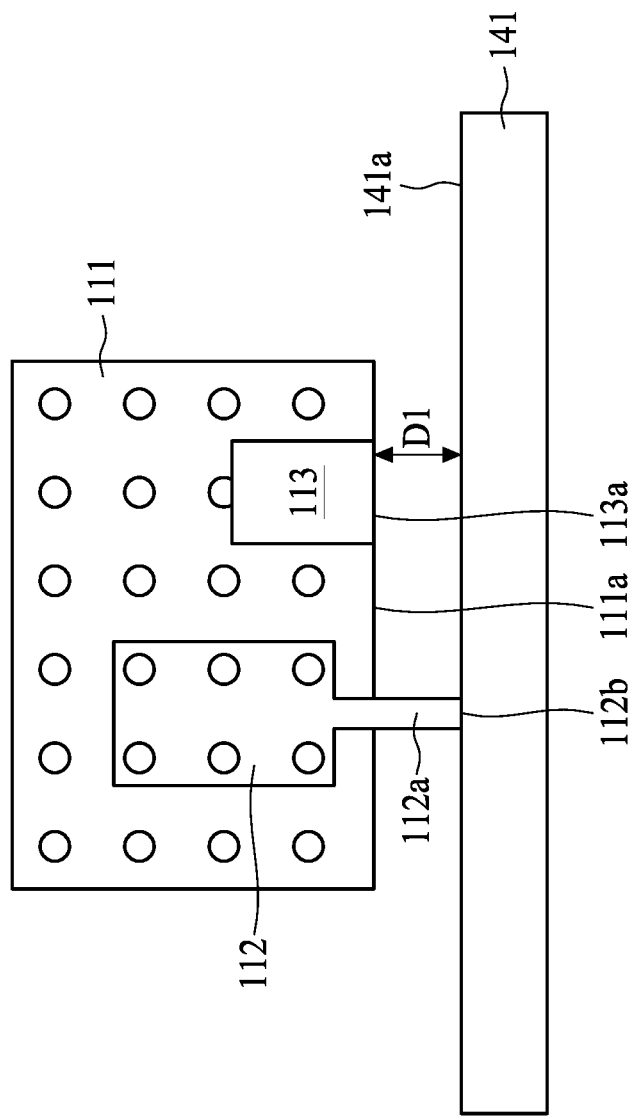

Referring to FIG. 12, the lower surface 112b of the probe 112a is brought to a desired level above the magnetron 141 based on the distance D1 recorded by the second sensor 113 as the reference reading. The carrier 111 is moved downward by the first motor 121, the second motor 122 and the third motor 131 toward the top surface 141a of the magnetron 141 until a distance between the top surface 141a of the magnetron 141 and the second sensor 113 is substantially equal to the distance D1. In the embodiments shown in FIG. 12, the lower surface 112b is vertically above and separated from the top surface 141a of the magnetron 141 by the distance D1. In some alternative embodiments, the lower surface 112b of the probe 112a is directly on the top surface 141a of the magnetron 141.

Figure 13:
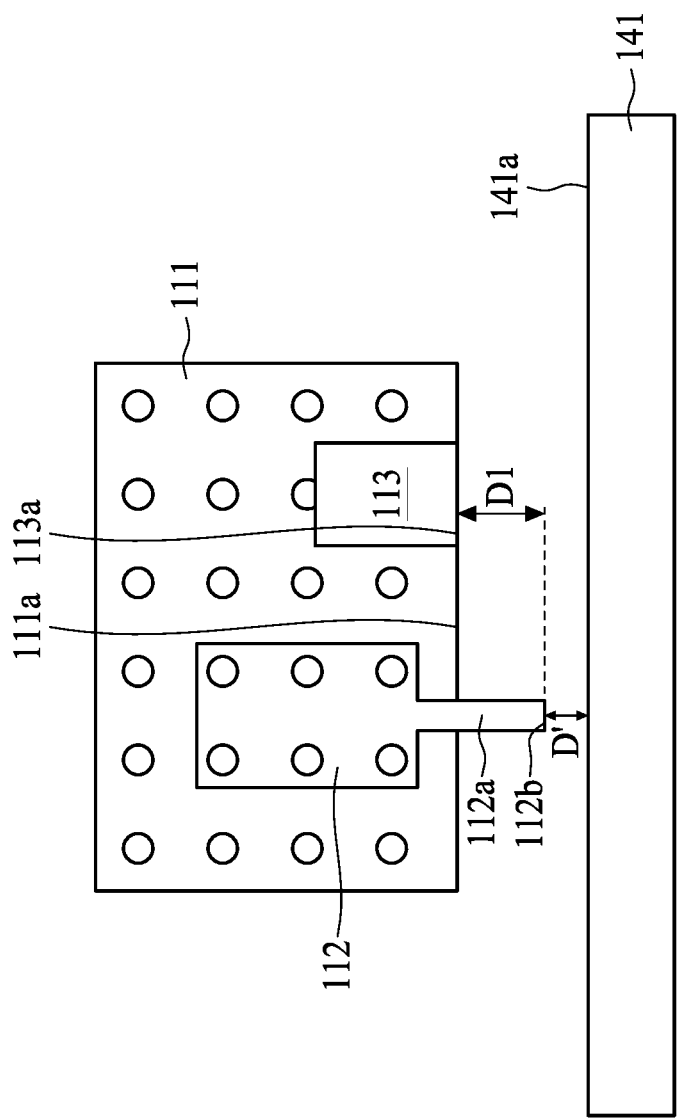
Figure 14:
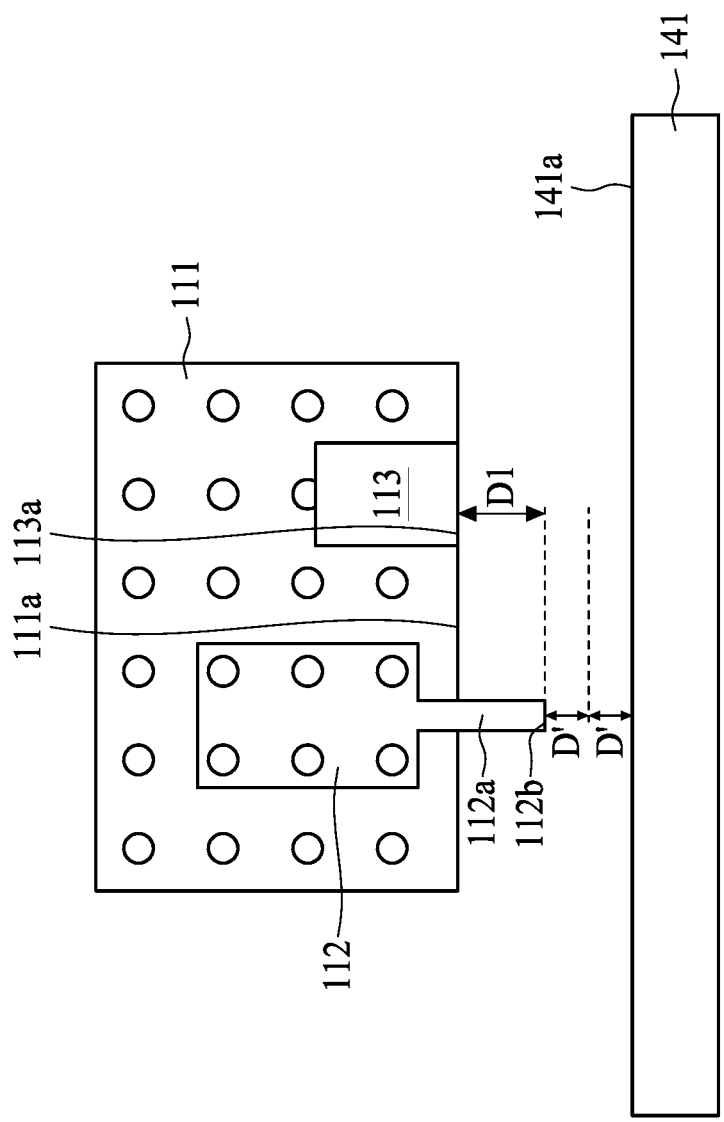

In some embodiments, the operation 304 is implemented as shown in FIG. 14. In the operation 304, magnetic field intensities at different elevations above the magnetron 141 are measured by the probe 112a. Referring to FIGS. 13 to 14, a power is supplied to operate the magnetron 141, and magnetic field is generated by the magnetron 141. As such, magnetic field intensities at different elevations above the magnetron 141 are measured by the measuring tool 112 through the probe 112a. The carrier 111 with the probe 112a and the second sensor 113 is moved upward away from the top surface 141a of the magnetron 141 in an interval D' to measure the magnetic field intensities. The magnetic field intensities of the magnetron 141 at sequential increments of the interval D' in the upward direction over the magnetron 141 can be obtained. The interval D' is not limited herein, and can be adjusted as required. As shown in FIG. 13, the carrier 111 is moved vertically away from the top surface 141a of the magnetron 141. When the second sensor 113 is separated from the top surface 141a by the distance equal to the interval D', a first magnetic field intensity is measured when the probe 112a is at the position shown in FIG. 13. Next, the carrier 111 continues to move farther away from the magnetron 141. In some embodiments, the carrier 111 is moved vertically farther away from the top surface 141a of the magnetron 141 by two times of the interval D', as shown in FIG. 14. A second magnetic field intensity is measured when the probe 112a is at the position shown in FIG. 14.

A correlation of the magnetic field intensities at different elevations over the top surface 141a of the magnetron 141 can be obtained by the measuring method illustrated above. The magnetron 141 can then be installed over a target in a PVD equipment.

Figure 15:
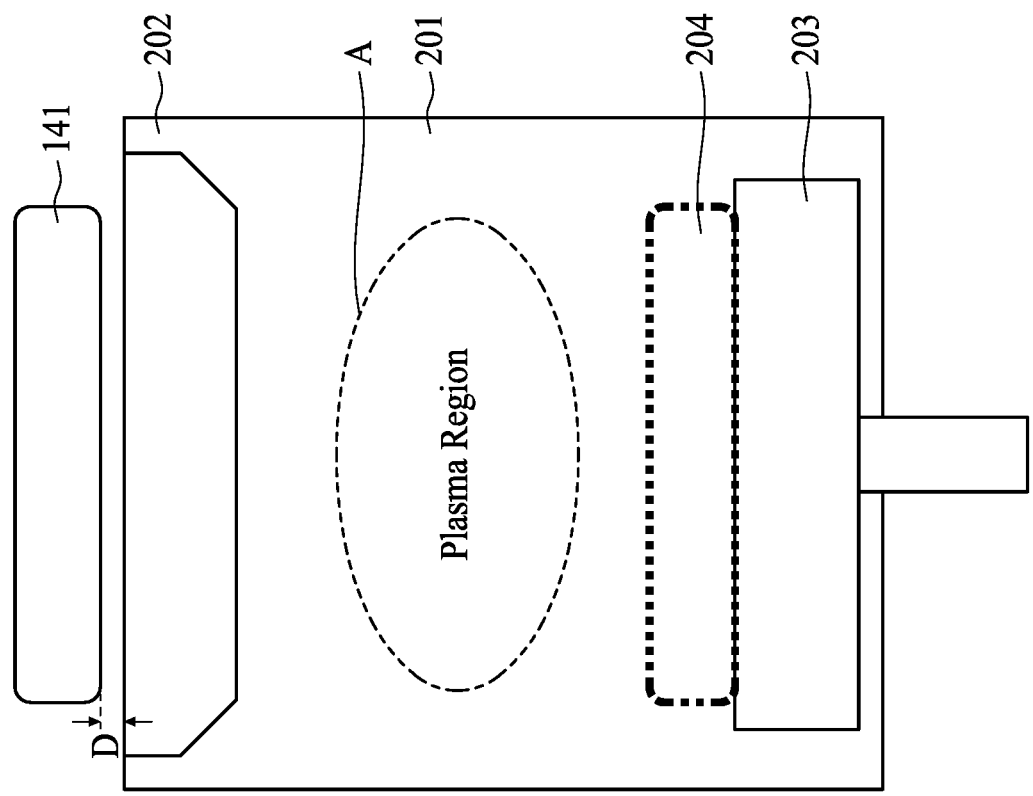
FIG. 15 is a schematic diagram of a PVD equipment in accordance with some embodiments of the present disclosure.

FIG. 15 is a schematic diagram of a PVD equipment 200 in accordance with some embodiments of the present disclosure. The PVD equipment 200 includes a chamber 201, a target 202 and a pedestal 203. The chamber 201 includes a plasma region A indicated by a dashed circle illustrating the region of plasma during a PVD operation. The target 202 is a sputtering target installed in the chamber 201 and configured to provide material of a PVD film to be formed on a substrate 204. The pedestal 203 is also disposed in the chamber 201 and configured to hold the substrate 204 thereon. The magnetron 141 is installed over the target 202 after the measuring method is performed. An optimum distance D is defined between the magnetron 141 and the target 202.

According to the correlation of the magnetic field intensities at different elevations above the top surface 141a of the magnetron 141 obtained by the measuring method, the optimum distance D can be determined. The optimum distance D having a better uniformity result is used in the mass production. Therefore, the measuring method of the present disclosure can provide mathematical correlation between the optimum distance and the uniformity of the PVD film, and a fabrication consistency and repeatability can be improved.

Figure 16:
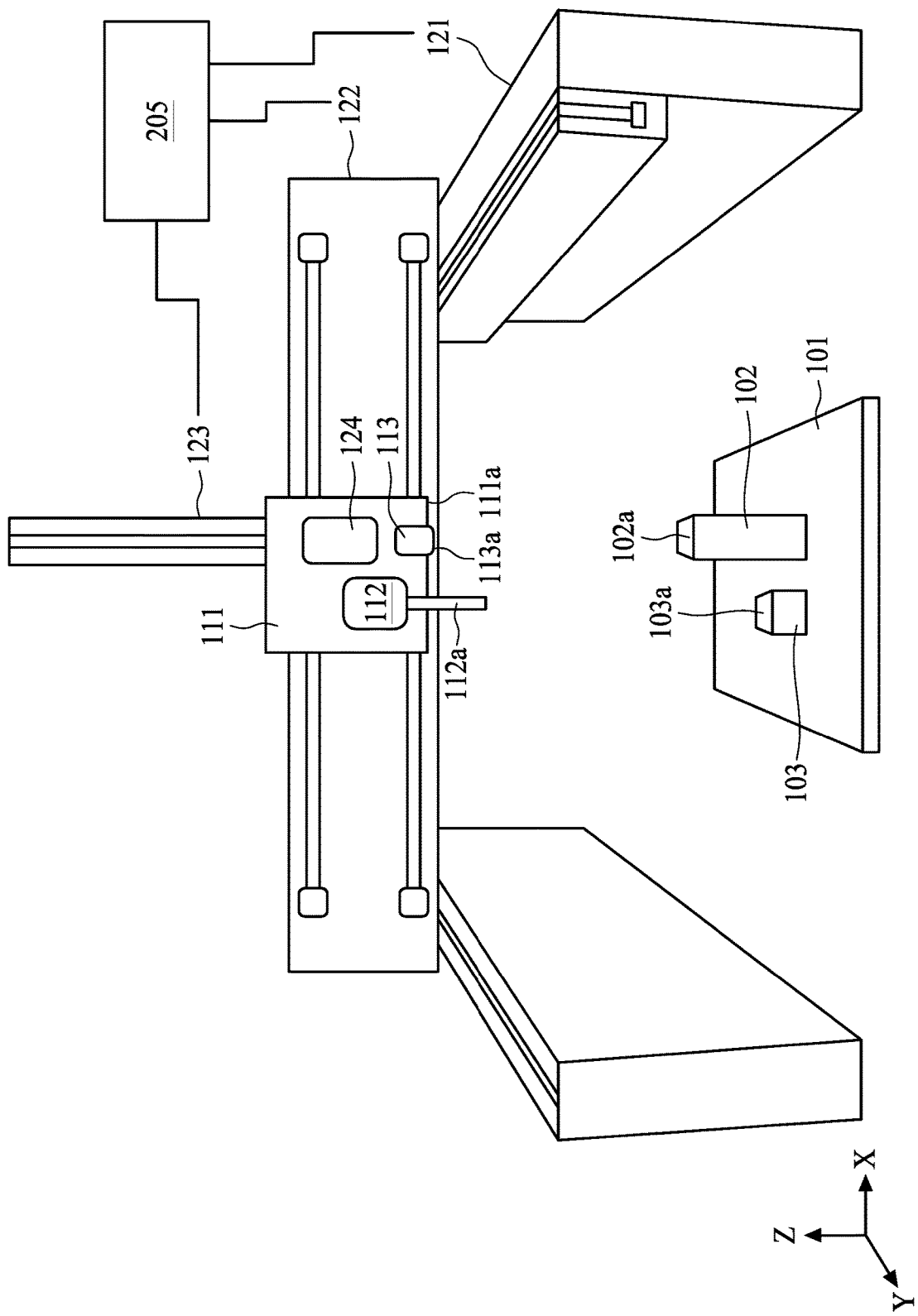
FIG. 16 is a schematic diagram of a calibration apparatus in accordance with some embodiments of the present disclosure.
Figure 17:
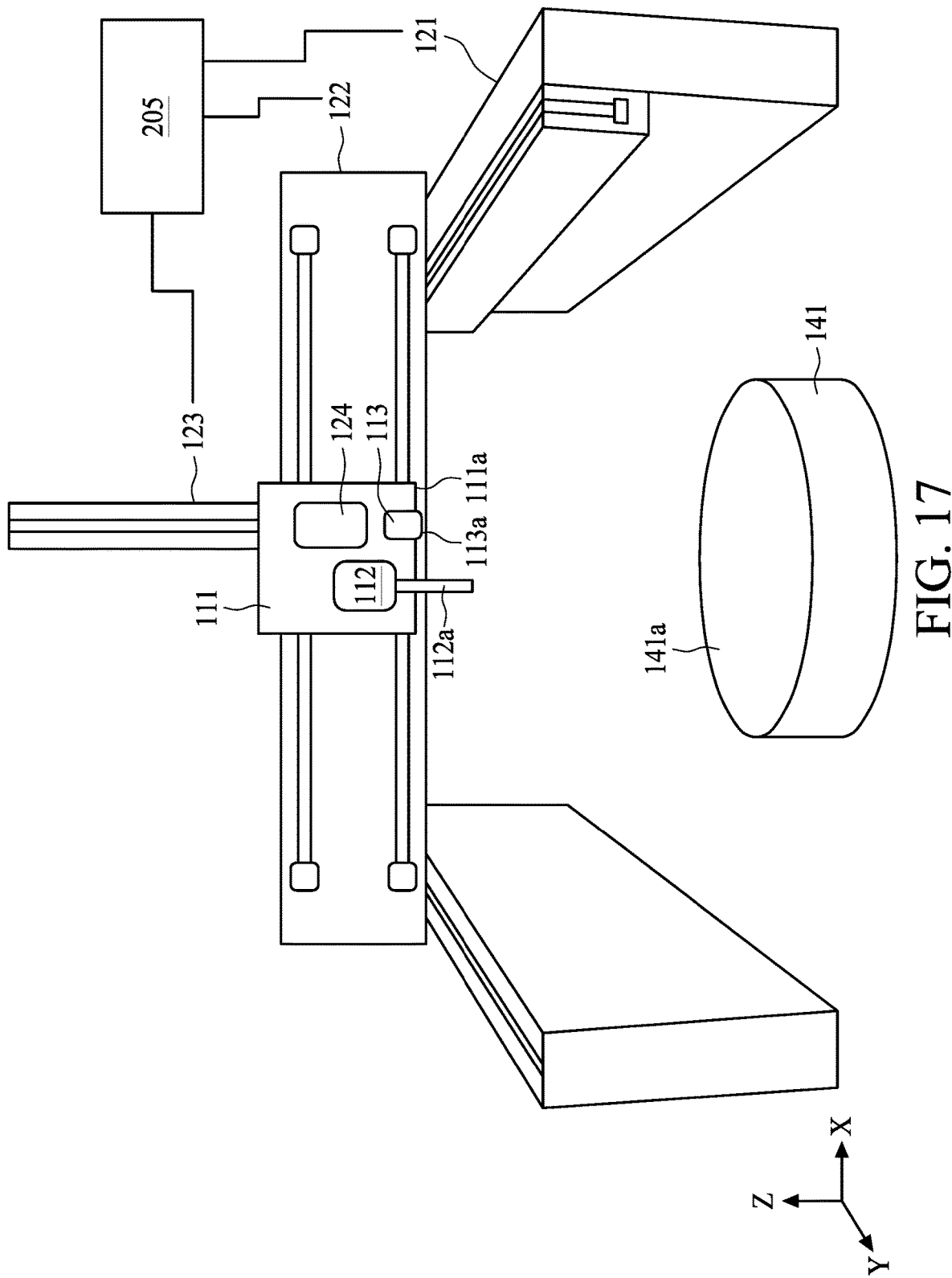
FIG. 17 is a schematic diagram of a calibration apparatus in accordance with some embodiments of the present disclosure.

In the embodiments described above, both the first sensor 103 and the second sensor 113 are optical sensors, and the method 300 can be automatically performed as shown in FIGS. 16 and 17. As illustration above, according to some embodiments of the present disclosure, a controller 205 is configured to actuate and coordinate the motors 121, 122, 123 to control movement of the carrier 111, and the software includes a first algorithm to communicate with the first senor 103 and the second sensor 113 and control the first motor 121, the second motor 122 and the third motor 133 to find the optimum distance D. The probe 112a is then moved over and around the center of the magnetron 141 using a second algorithm of the software as shown in FIG. 17. The second algorithm also ensures electron beams of the second sensor 113 fall on the top surface 141a of the magnetron 141. However, the present disclosure is not limited thereto the embodiments as illustrated above and in FIGS. 3 to 14. In some alternative embodiments, the first sensor 103 and the second sensor 113 can include one or more pressure sensors. The method 300 can also be applied to the embodiments using a pressure sensor as the first sensor 103 and/or the second sensor 113.

Figure 18:
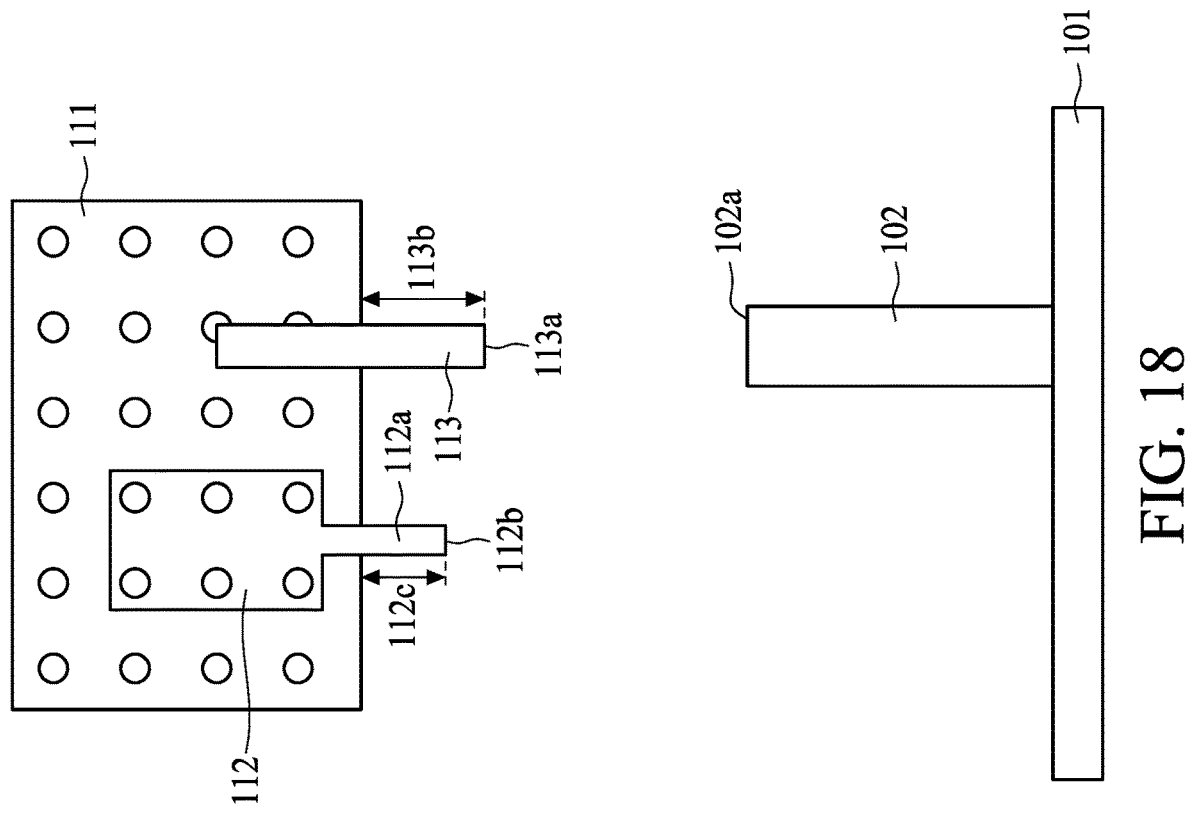
FIG. 18 is a schematic diagram illustrating a reading range of an optical sensor in accordance with some embodiments of the present disclosure.
Figure 19:
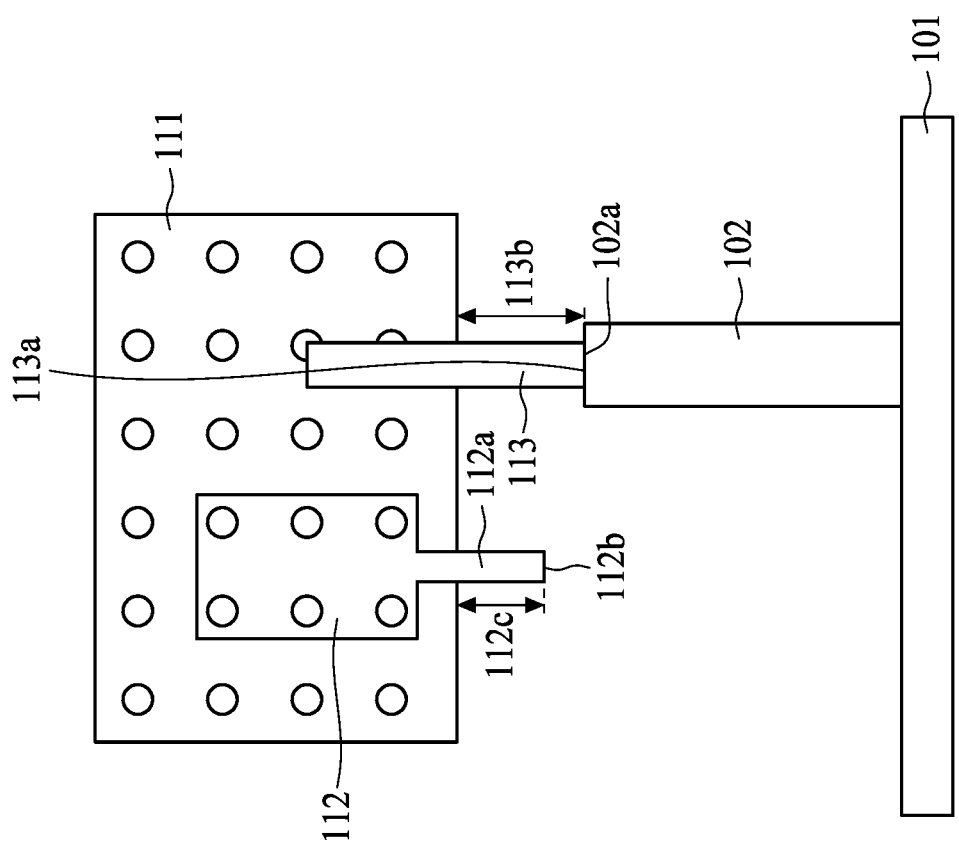
FIGS. 19 to 21 are schematic diagrams illustrating using only one pressure sensor to perform the methods shown in FIGS. 15 to 17 in accordance with some embodiments of the present disclosure.

Referring to FIGS. 18 to 19, in accordance with some embodiments, the second sensor 113 is a pressure sensor, and no first sensor 103 is installed on the jig 101. In the embodiments, a protrusion 112c of the probe 112a from the carrier 111 is designed to be less than a protrusion 113b of the second sensor 113 from the carrier 111 as shown in FIG. 18. After the second sensor 113 is disposed over the reference bar 102, the second sensor 113 is moved toward the reference bar 102 by the third motor 123 until the second sensor 113 contacting the reference bar 102 is detected by the second sensor 113 as shown in FIG. 19.

In some embodiments, the second sensor 113 is disposed over and aligned with the reference bar 102 manually by an operator controlling the first motor 121, the second motor 122 and the third motor 123. In some embodiments, a location of the reference bar 102 is stored in the software of the calibration apparatus 100, and the second sensor 113 can be automatically disposed over and aligned with the reference bar 102. Therefore, in the embodiments illustrated in FIGS. 18 to 19, the method 300 can be performed semi-automatically or automatically.

Figure 20:
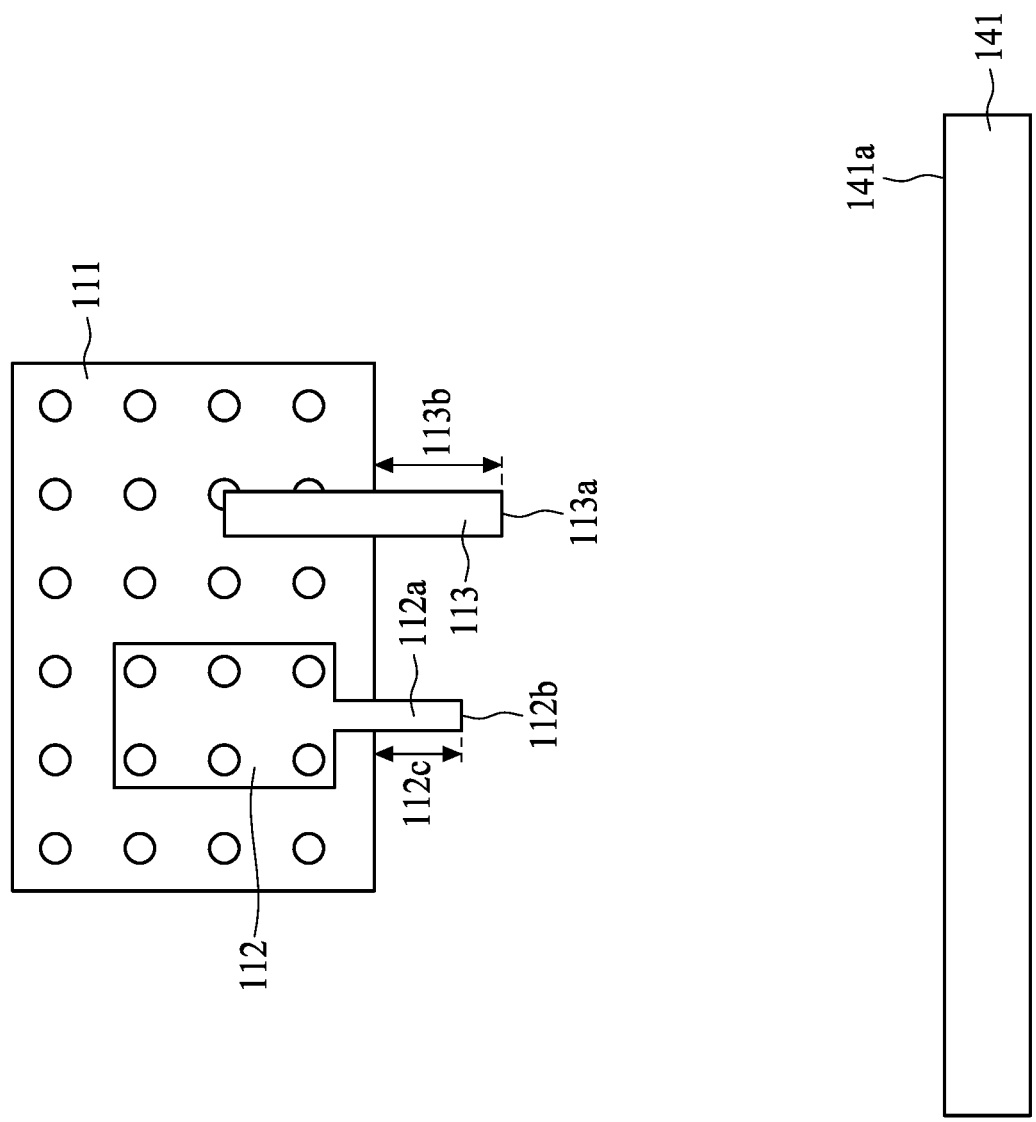
Figure 21:
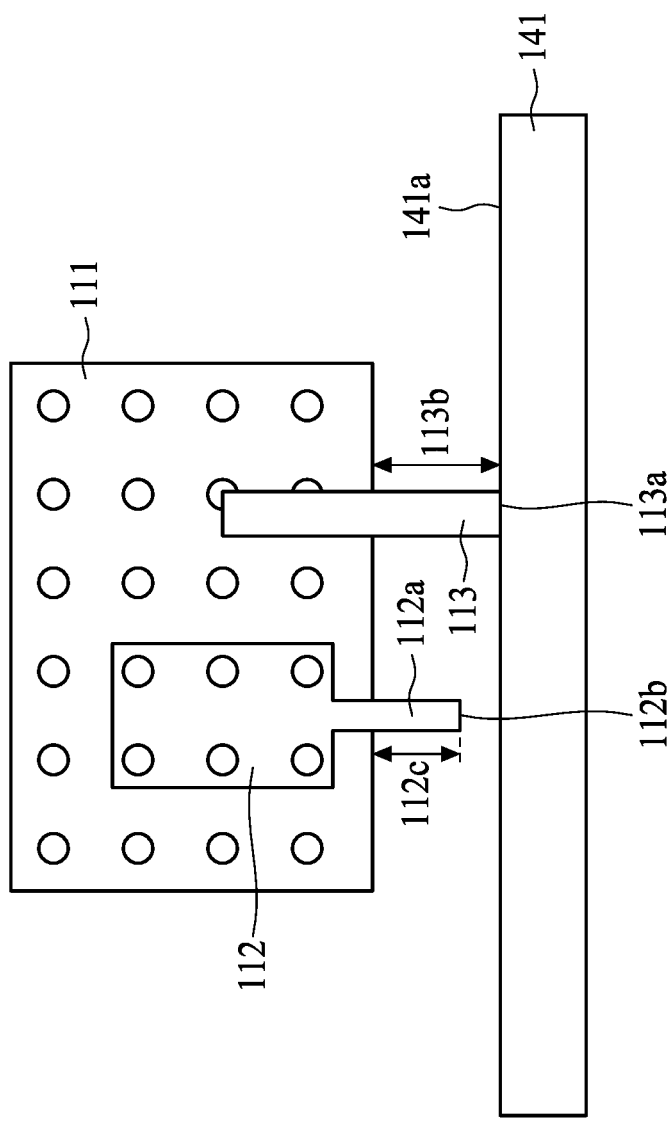

Referring to FIGS. 20 to 21, the carrier 111 including the probe 112a and the second sensor 113 is moved over a center of the top surface 141a of the magnetron 141 as shown in FIG. 19. The carrier 111 is then moved toward the magnetron 141 by the third motor 33 until the second sensor 113 detects contact between the magnetron 141 and the second sensor 113. The magnetic field intensities of the magnetron 141 at different elevations are then measured by moving the carrier 111 upward in sequential increments equal to a predetermined interval.

Figure 22:
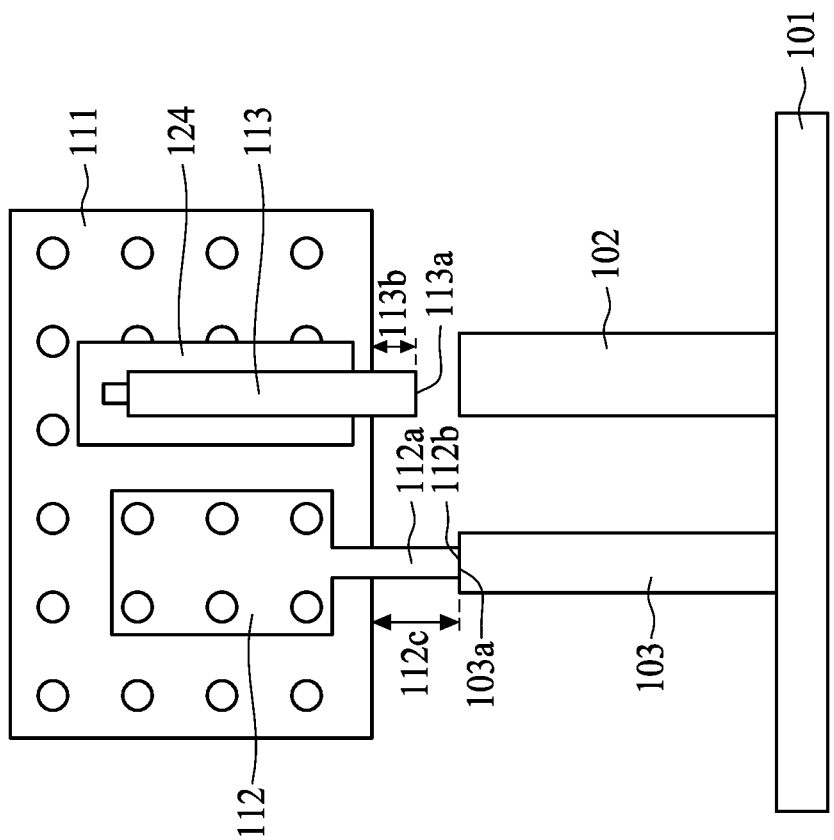
FIGS. 22 to 24 are schematic diagrams illustrating using both pressure sensors to perform the methods shown in FIGS. 15 to 17 in accordance with some embodiments of the present disclosure.
Figure 23:
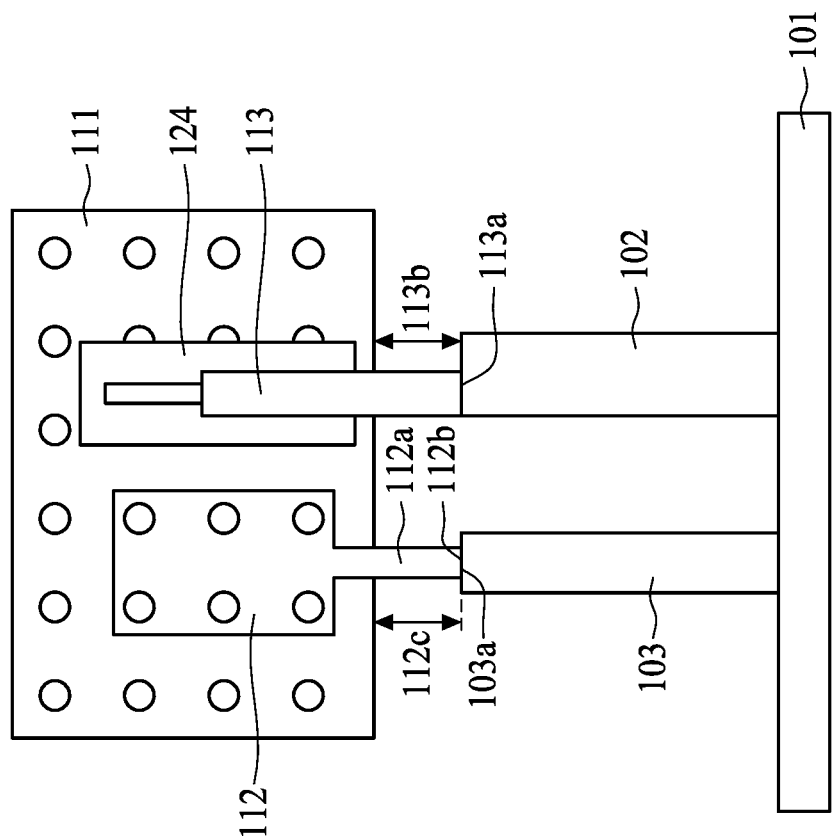
Figure 24:
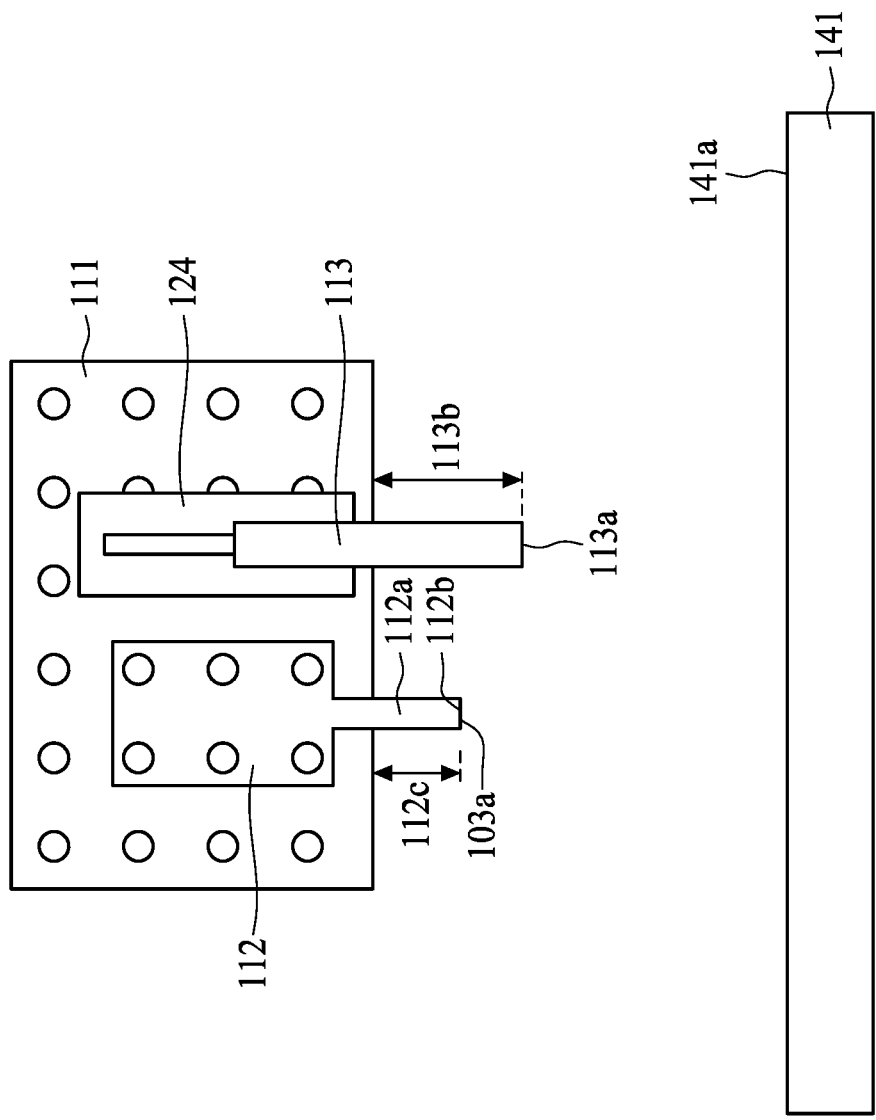

Referring to FIGS. 22 to 24, in accordance with some embodiments, both the first sensor 103 and the second sensor 113 are pressure sensors. The fourth motor 124 is disposed on the carrier 111 having a track to control an elevation of the second sensor 113. In the embodiments, the third motor 123 is controlled to move the probe 112a vertically. In some embodiments, the probe 112a is moved over the first sensor 103 manually prior to the probe 112a contacting with the first sensor 13. In some embodiments, a location of the first sensor 103 is stored in the software, and the probe 112a can be moved automatically to vertically align with the first sensor 13. In some embodiments, the first sensor 103 can locate the probe 112a once the lower surface 112b of the probe 112a contacting with the first sensor 103 is detected by the first sensor 103 as shown in FIG. 22.

After locating the probe 112a, the second sensor 113 is moved downward by the fourth motor 124 to detect the top surface 102a of the reference bar 102 as shown in FIG. 23. The second sensor 113 records that a distance between the reference bar 102 and the carrier 111 is equal to the protrusion 113b of the second sensor 113. It should be noted that, in the embodiments, a protrusion 113b of the second sensor 113 as shown in FIG. 22 before the detection of the reference bar 102 is less than the protrusion 112c of the probe 112a as shown in FIG. 23.

In some embodiments using a pressure sensor for the first sensor 103, a height of the reference bar 102 is designed to be substantially equal to a height of the first sensor 103. The carrier 111 is then moved over the magnetron 141 for measurement of the magnetic field intensities at different elevations as shown in FIG. 24. In some embodiments, in order to ensure no contact of the probe 112a and the magnetron 141 for a purpose of avoiding damage, the second sensor 113 is moved farther downward to have the protrusion 113b greater than the protrusion 112c before the second sensor 113 contacting the top surface 141a of the magnetron 141. The second sensor 113 is then moved toward the magnetron 141 until the second sensor 113 contacting with the magnetron 141 detected by the second sensor 113. The magnetic field intensities of the magnetron 141 at different elevations are then measured by moving the carrier 111 upward in sequential increments equal to a predetermined interval. Therefore, in the embodiments illustrated in FIGS. 22 to 24, the method 300 can be performed semi-automatically or automatically.

Figure 26:
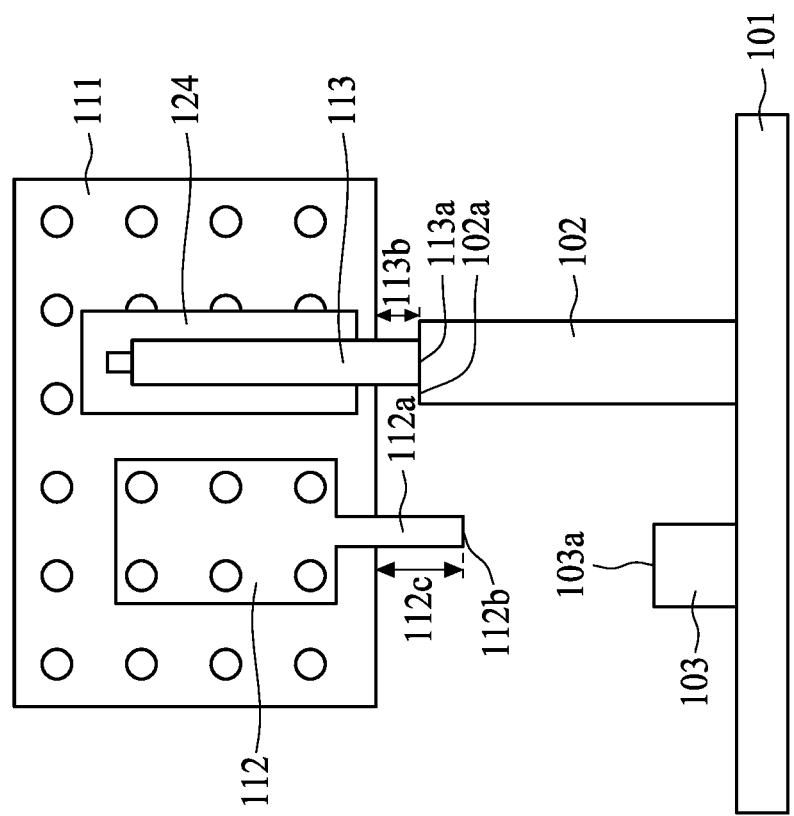
Figure 27:
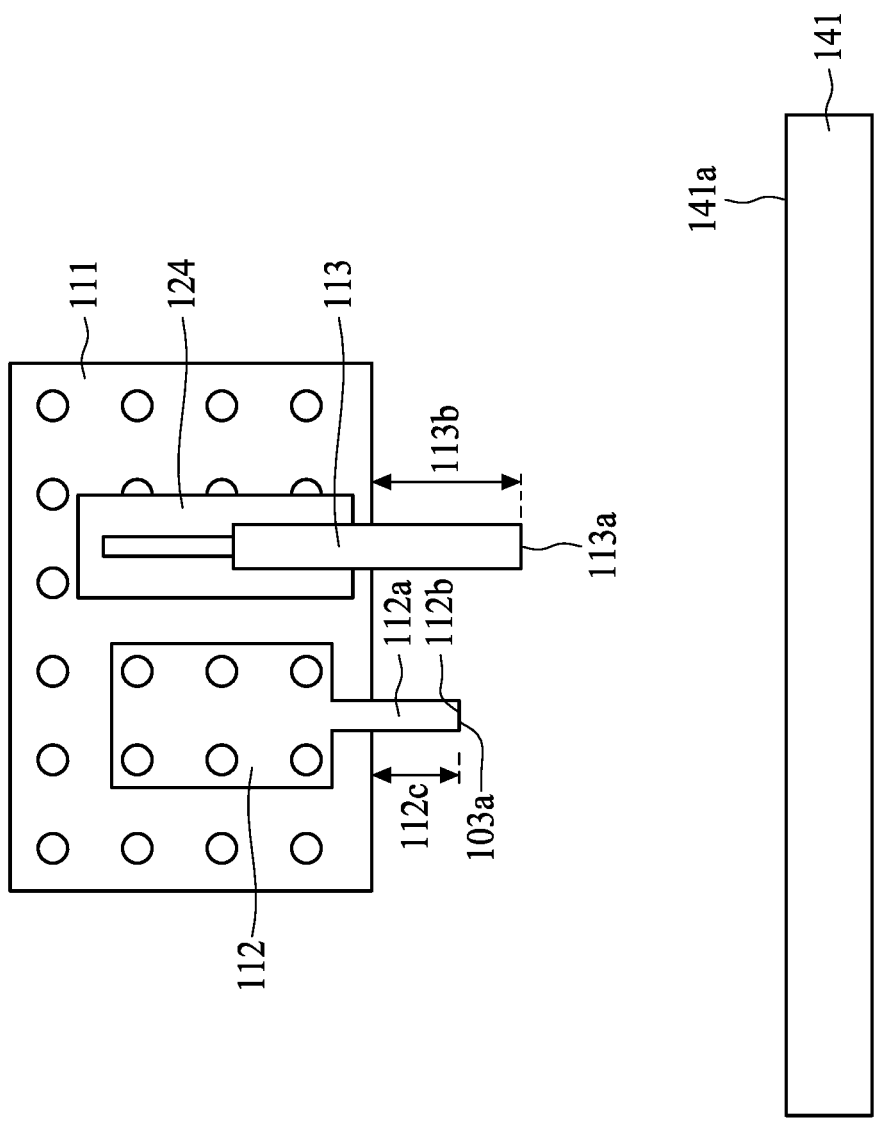

Referring to FIGS. 25 to 27, in accordance with some embodiments, the first sensor 103 is an optical sensor and the second sensor 113 is a pressure sensor. In the embodiments, the first sensor 103 is similar to the first sensor 103 as illustrated in FIGS. 3 to 14 and described in relevant paragraphs above. The first sensor 103 is configured to locate the probe 112a and detect the lower surface 112b of the probe 112 when the lower surface 112b is coplanar with the top surface 102a of the reference bar 102. The fourth motor 124 is disposed on the carrier 111 having the track to control an elevation of the second sensor 113. The second sensor 113 in the embodiments is similar to the second sensor 113 as illustrated in FIGS. 22 to 24. The second sensor 113 is configured to detect a distance between the carrier 111 and the reference bar 102, wherein the protrusion 113b of the second sensor 113 from the carrier 111 is controlled by the fourth motor 124 and may be different in different stages of the method 300.

As shown in FIG. 26, the protrusion 113b of the second sensor 113 is for recording the distance between the carrier 111 and the top surface 102a of the reference bar 102 when the lower surface 112b is coplanar with the top surface 102a. As shown in FIG. 27, the protrusion 113b greater than the protrusion 112c is used to detect the top surface 141a of the magnetron 141 to ensure the probe 112b is separated from the magnetron 141. The magnetic field intensities of the magnetron 141 at different elevations are then be measured by moving the carrier 111 upward every predetermined interval. Therefore, in the embodiments illustrated in FIGS. 25 to 27, the method 300 can be performed automatically.

Figure 28:
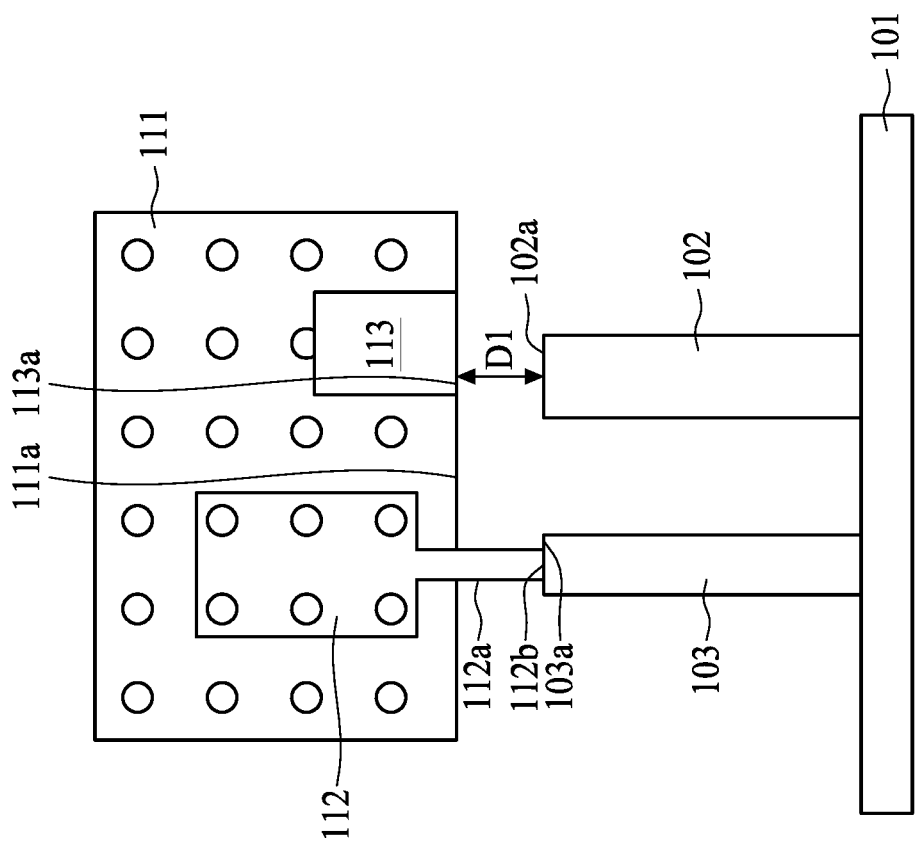
FIGS. 28 to 29 are schematic diagrams illustrating using a pressure sensor and an optical sensor in accordance with some embodiments of the present disclosure.
Figure 29:
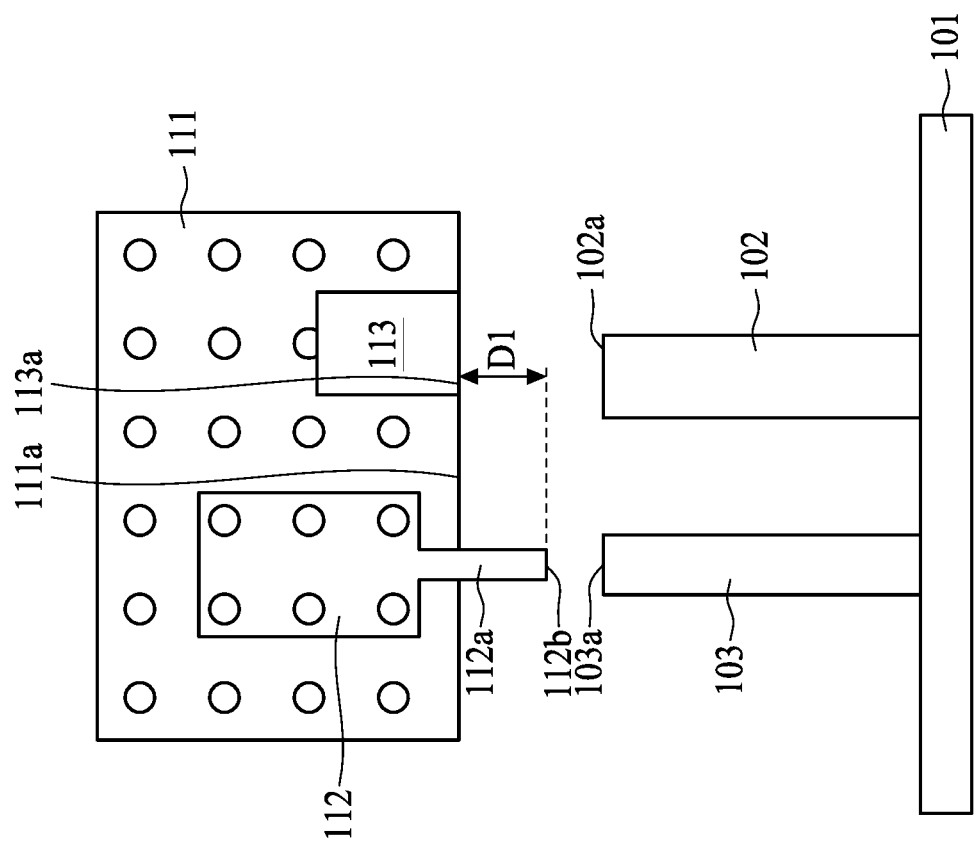

Referring to FIGS. 28 to 29, in accordance with some embodiments, the first sensor 103 is a pressure sensor and the second sensor 113 is an optical sensor. The function and procedure of the using of the first sensor 103 to detect the lower surface 112b of the probe 112 are as illustrated in FIG. 22 and above relevant paragraphs. The function and procedure of the using of the second sensor 113 to determine the distance D1 and bring the probe 112a to a desired level above the magnetron 141 are as illustrated in FIGS. 3 to 14 and described in relevant paragraphs above. After the first sensor 103 detects the lower surface 112b of the probe 112, the distance D1 is recorded by the second sensor 113. As shown in FIG. 28, in some embodiments, the distance D1 is recorded without an additional gap. As shown in FIG. 29, in some embodiments, a reading is recorded after adding the additional gap. Therefore, in the embodiments illustrated in FIGS. 28 to 29, the method 300 can be performed semi-automatically or automatically.

Some embodiments of the present disclosure provide a measuring method. The method includes several operations. A probe and a first sensor are disposed over a jig including a bar protruding from the jig. The probe is moved until a first surface of the probe is laterally aligned with a second surface of the bar facing the jig. A first distance between the second surface of the bar and the first sensor is obtained by the first sensor. The probe and the first sensor are disposed over a magnetron. Magnetic field intensities at different elevations above the magnetron are measured by the probe.

Some embodiments of the present disclosure provide a measuring method. The method includes several operations. A jig including a first sensor and a reference bar installed on the jig is provided. A carrier is moved over the jig, wherein a second sensor and a probe are installed on the carrier. The probe and the reference bar are aligned with the first sensor and the second sensor respectively. A lower surface of the probe is detected by the first sensor. A distance between the second sensor and the reference bar is recorded by the second sensor. The carrier is moved toward a magnetron. The lower surface of the probe is brought to a desired level above the magnetron based on the distance recorded by the second sensor. The probe is moved in an upward direction to measure magnetic field intensities of the magnetron at different elevations.

Some embodiments of the present disclosure provide an apparatus for calibration. The apparatus includes a bar and a first sensor protruded from and installed on a jig; a probe and a second sensor installed on a carrier and disposed over the first sensor and the bar; a motor configured to control movement of the carrier; and a controller electrically connected and configured to control the motor, wherein the carrier is movable over and toward the jig by the motor to align the probe and the second sensor with the first sensor and the bar respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A measuring method, comprising:
    disposing a probe and a first sensor over a jig including a bar protruding from the jig;
    moving the probe until a first surface of the probe is laterally aligned and coplanar with a second surface of the bar facing the jig;
    obtaining a first distance between the second surface of the bar and the first sensor by the first sensor;
    disposing the probe and the first sensor over a magnetron; and
    measuring magnetic field intensities at different elevations above the magnetron by the probe.

2. The measuring method of claim 1, wherein after the disposing of the probe and the first sensor over the magnetron, a distance between the magnetron and the first sensor is substantially equal to the first distance.

3. The measuring method of claim 1, further comprising:
moving the probe and the first sensor away from the bar by a second distance, prior to the obtaining of the first distance.

4. The measuring method of claim 3, wherein after the disposing of the probe and the first sensor over the magnetron, a distance between the magnetron and the probe is substantially equal to the second distance.

5. The measuring method of claim 1, wherein the probe and the first sensor are connected to one or more motors, and the disposing of the probe and the first sensor over the jig includes moving the probe and the first sensor by the one or more motors.

6. The measuring method of claim 5, wherein the disposing of the probe and the first sensor includes operating a first motor and a second motor of the one or more motors to move the probe and the first sensor horizontally, and the moving of the probe includes operating a third motor of the one or more motors to move the probe vertically.

7. The measuring method of claim 1, wherein the moving of the probe comprises:
moving the probe in a vertical direction;
detecting the first surface of the probe by a second sensor installed adjacent to the bar; and
stopping the probe when the first surface of the probe is laterally aligned with the second surface of the bar according to the detection of the second sensor.

8. The measuring method of claim 1, wherein the probe and the first sensor are installed on a carrier, and the disposing of the probe and the first sensor over the jig includes:
moving the carrier over the jig to dispose the first sensor over the bar.

9. The measuring method of claim 1, wherein the disposing of the probe and the first sensor over the magnetron comprises moving the first sensor over a center of the magnetron.

10. A measuring method, comprising:
providing a jig including a first sensor and a reference bar installed on and protruded from a surface of the jig;
moving a carrier over the jig, wherein a second sensor and a probe are installed on the carrier;
aligning the probe and the reference bar with the first sensor and the second sensor respectively;
detecting a lower surface of the probe by the first sensor;
recording a distance between the second sensor and the reference bar by the second sensor;
moving the carrier over a magnetron;
bringing the probe toward the magnetron based on the distance recorded by the second sensor; and
moving the probe in an upward direction to measure magnetic field intensities of the magnetron at different elevations.

11. The measuring method of claim 10, further comprising:
defining a distance from the first sensor as a zero reading of the first sensor prior to the moving of the carrier over the jig.

12. The measuring method of claim 11, wherein a height difference between the first sensor and the reference bar is substantially equal to the zero reading of the first sensor.

13. The measuring method of claim 10, wherein the bringing of the probe toward the magnetron comprises:
detecting a distance between the second sensor and a top surface of the magnetron by the second sensor; and
moving the carrier toward the top surface of the magnetron until the distance between the second sensor and the top surface of the magnetron is substantially equal to the distance recorded by the second sensor.

14. The measuring method of claim 10, wherein the probe is brought to a desired level above the top surface of the magnetron without touching the top surface of the magnetron.

15. The measuring method of claim 10, further comprising:
correlating the magnetic field intensities of the magnetron with the different elevations, wherein distances between the magnetron and the lower surface of the probe are recorded by the second sensor; and
installing the magnetron in a physical vapor deposition (PVD) equipment, wherein a distance between the magnetron and a sputtering target equals to one of the distances recorded by the second sensor.

16. An apparatus for calibration, comprising:
a bar and a first sensor protruded from and installed on a jig;
a probe and a second sensor installed on a carrier and disposed over the first sensor and the bar;
a motor configured to control movement of the carrier; and
a controller electrically connected and configured to control the motor,
wherein the carrier is movable over and toward the jig by the motor to align the probe and the second sensor with the first sensor and the bar respectively.

17. The apparatus of claim 16, wherein the probe protrudes from the carrier.

18. The apparatus of claim 16, wherein a lower surface of the second sensor is substantially coplanar with a lower surface of the carrier.

19. The apparatus of claim 16, wherein the carrier is movable above the jig and along a direction substantially orthogonal to a top surface of the bar.

20. The apparatus of claim 16, wherein the probe is configured to measure a magnetic field intensity.

* * * * *